(12) United States Patent
Huang et al.

(10) Patent No.: US 6,885,241 B2
(45) Date of Patent: Apr. 26, 2005

(54) TYPE-BASED BASEBAND PREDISTORTER FUNCTION ESTIMATION TECHNIQUE FOR NON-LINEAR CIRCUITS

(75) Inventors: Xinping Huang, Nepean (CA); Mario Caron, Aylmer (CA)

(73) Assignee: Her Majesty the Queen in right of Canada, as represented by the Minister of Industry, Ottawa (CA)

( * ) Notice: Subject to any disclaimer, the term of this patent is extended or adjusted under 35 U.S.C. 154(b) by 0 days.

(21) Appl. No.: 10/396,391

(22) Filed: Mar. 26, 2003

(65) Prior Publication Data

US 2003/0184374 A1 Oct. 2, 2003

Related U.S. Application Data

(60) Provisional application No. 60/367,208, filed on Mar. 26, 2002.

(51) Int. Cl.[7] .............................................. H03F 1/26
(52) U.S. Cl. ....................... 330/149; 375/296; 455/126
(58) Field of Search ................................ 330/136, 149; 375/296, 297; 455/114.3, 126

(56) References Cited

U.S. PATENT DOCUMENTS

| | | |
|---|---|---|
| 4,291,277 A | 9/1981 | Davis et al. |
| 5,049,832 A | 9/1991 | Cavers |
| 5,760,646 A | 6/1998 | Belcher et al. |
| 5,867,065 A | 2/1999 | Leyendecker |
| 5,903,823 A * | 5/1999 | Moriyama et al. .......... 330/149 |
| 5,990,734 A | 11/1999 | Wright et al. |
| 6,054,894 A | 4/2000 | Wright et al. |
| 6,054,896 A | 4/2000 | Wright et al. |
| 6,072,364 A | 6/2000 | Jeckeln et al. |
| 6,075,411 A | 6/2000 | Briffa et al. |
| 6,112,062 A | 8/2000 | Hans et al. |
| 6,141,390 A | 10/2000 | Cova |
| 6,246,286 B1 * | 6/2001 | Persson ...................... 330/149 |
| 6,275,685 B1 | 8/2001 | Wessel et al. |
| 6,307,435 B1 | 10/2001 | Nguyen et al. |
| 6,342,810 B1 | 1/2002 | Wright et al. |
| 6,552,609 B1 * | 4/2003 | Hamada et al. ............. 330/149 |

FOREIGN PATENT DOCUMENTS

WO    WO 98/28888 A1    7/1998

OTHER PUBLICATIONS

Jin et al., "Piecewise Polynomial Predistorter for Power Amplifier", Proceedings of CIC 2002, Oct. 29, 2002–Nov. 1, 2002.

Besbes et al., "A Fast Adaptive Predistorter for Nonlinearly Amplified M–QAM Signals", Proceedings of Globecom '00, vol. 1, Nov. 27, 2000–Dec. 1, 2000, pp 108–112.

Ren et al., "Improvement of Digital Mapping Predistorters for Linearising Transmitters", 1997 IEEE MTT S–Digest, pp 1691–1694.

Ghaderi et al., "Adaptive Predistortion Lineariser Using Polynomial Functions", IEE Proc.–Commun., vol. 141, No. 2, Apr. 1994, pp 49–55.

Cavers, "Amplifier Linearization Using a Digital Predistorter with Fast Adaptation and Low Memory Requirements", IEEE Transactions of Vehicular Technology, vol. 39, No. 4, Nov. 1990, pp 374–382.

* cited by examiner

*Primary Examiner*—Khanh V. Nguyen
(74) *Attorney, Agent, or Firm*—Freedman & Associates

(57) ABSTRACT

This invention is about a novel estimation technique for generating a predistortion function to compensate for the AM-AM and AM-PM non-linear conversion distortions of non-linear power amplifiers or non-linear circuits. Based on the cumulative type of power amplifier output envelope, a non-parametric baseband predistortion function is derived. The non-parametric approach avoids any model mismatch. In addition, the technique does not need to demodulate the input signal. Furthermore, it minimizes the effect of the power amplifier non-linearity and significantly improves the system performance

38 Claims, 17 Drawing Sheets

| | |
|---|---|
| Parameters: | $P_I(a_n)$ is the ideal CDF array |
| | $P_A(a_n)$ is the PA output CDF array |
| | $N$ is the length of $P_I(a_n)$ and $P_A(a_n)$ |
| | $a_n$ is the normalized input envelope level used to derive $P_I(a_n)$ and $P_A(a_n)$, where $a_n = (n-1)/(N-1)$ |
| | $x_n$ and $y_n$ are input and output of the predistorter, respectively |
| | $k$ and $T$ are temporary variables |
| Initialize: | $k=1$ |
| Given: | $P_I(a_n)$, $P_A(a_n)$ and $a_n$ |
| Compute: | For $n=1, 2, ..., N$, |

$$x_n = a_n$$
$$T = P_A(a_n)$$
while $T > P_I(a_k)$
$$k = k+1$$
end while
if
$k = 1$
$$y_1 = a_1$$
else
$$y_n = a_{k-1} + \frac{a_k - a_{k-1}}{P_I(a_k) - P_I(a_{k-1})}(T - P_I(a_{k-1}))$$
end if
end for

Fig. 7

*Parameters:*    $h(\varphi_m, a_n)$ is a 2-D array of the ideal phase histogram $h_d(\varphi_m, a_n)$ is a 2-D array of the PA output phase histogram $M$ and $N$ are the dimensions of $h(\varphi_m, a_n)$ and $h_d(\varphi_m, a_n)$, respectively $\varphi_m$ is the PA output phase in degree, $m=1,\ldots, M$, where $\varphi_m = 360° \times (m-1)/M$ $a_n$ is the normalized input envelope level, $n=1,\ldots N$, where $a_n = (n-1)/(N-1)$ $u_n$ and $v_n$ are input and output of the phase predistorter, respectively

*Initialize:*    $n=1$
*Given:*    $h(\varphi_n, a_n)$, $h_d(\varphi_n, a_n)$, $\varphi_n$ and $a_n$
*Compute:*
     For $n=1, 2, \ldots, N$,
         $u_n = a_n$ (degree)
         For $m=1,2, \ldots, M$,
             If $m=1$
$$r(m) = \sum_{k=1}^{M} h(\varphi_k, a_n) h(\varphi_k, a_n)$$
             Else
$$r(m) = \sum_{k=1}^{M-m+1} h(\varphi_k, a_n) h(\varphi_{k+m-1}, a_n) + \sum_{k=1}^{m-1} h(\varphi_{M-m+k}, a_n) h(\varphi_k, a_n)$$
             End if
         End for
$$m_{\max} = \arg\left\{\max_m \{r(m)\}\right\}$$
         $v_n = -360(m_{\max} - 1)/M$ (degree)
     End for

Fig. 13

TYPE-BASED BASEBAND PREDISTORTER FUNCTION ESTIMATION TECHNIQUE FOR NON-LINEAR CIRCUITS

This application claims priority from U.S. Provisional Application No. 60/367,208 filed on Mar. 26, 2002.

FIELD OF THE INVENTION

The invention relates to the area of non-linear circuits and more specifically to the area of compensating for non-linearities introduced into signals by signal processing circuits.

BACKGROUND OF THE INVENTION

In wireless communication systems, an input signal is provided to a transmitter for transmission therefrom. Typically prior to transmitting the signal, the transmitter conditions the signal so that it is in a form suitable for transmission. Such conditioning typically involves power amplification, where it is desirable to operate power amplifiers (PAs) near saturation in order to attain high power efficiency. Unfortunately, such operation typically introduces non-linear distortion in the amplified signal. This is evidenced by spectrum re-growth, which diverts some of the energy from a desired frequency channel into adjacent frequency channels. This results in a loss of performance within a desired frequency channel as well as the creation of interference within adjacent frequency channels.

For space applications, analog linearization circuits are often used in conjunction with PAs and are manually tuned for each PA in an attempt to provide optimum performance. In general, this is costly but considered necessary for space applications where total available power for signal transmission is very limited. For ground terminal use, the use of a linearization circuit is typically not implemented due to its cost. Instead, a more powerful PA is utilized and operated in an input back-off mode of operation—with a reduced output power level. The reduction in power amplifier output capability is typically a less costly implementation than the use of a linearization circuit. However, at microwave and mm-wave frequencies above around 30 GHz the output power capability of PA's is currently very limited and thus a more efficient use of the available power would significantly reduce the cost. In some cases, about 70% of the cost of 30/20 GHz satellite terminal is in the RF front end, with approximately half of this cost associated with the PA.

Furthermore, above 1 W the cost of an SSPA today increases linearly with increased output power. Given that 1–2 dB back-off is usually required for QPSK signals, which results in a loss of 20–40% efficiency, any increase in efficiency is likely to translate to a significant power advantage especially with the advent of 8-PSK and 16-QAM in satellite systems.

In the prior art, there are numerous techniques that have been employed in order to operate power amplifiers near saturation to attain high power efficiency while maintaining amplified signal linearity.

The prior art is limited in that spectrum efficient modulation, such as a multi-level quadrature amplitude modulation, or pulse shaping filters with a small roll-off factor, resulting in a significant envelope variation, often cannot be used due to the need to operate the PA within its linear region. Thus, efficiency of the PA is reduced. Additional limitations found in the prior art are a need to down-convert and demodulate the PA output signal, the comparing of the input signal to the reconstructed signal from the output port of the PA, a need to interrupt signal transmission, or they are limited to non-transmit periods of time, which is suitable for TDMA systems but not to FDMA systems. Additionally, a need for a training sequence and in some cases an accurately generated reference signal, or high computational requirements resulting in convergence to a solution being non trivial. Lastly, many of the prior art techniques require sampling of the PA output signal at a high sampling rate that is higher than the symbol rate of the input signal—most often at or above the Nyquist rate.

SUMMARY OF THE INVENTION

In accordance with the invention there is provided a method of compensating for non-linear conversion distortions of a circuit comprising the steps of: (a) providing a reference type information for an input signal being provided to the circuit; (b) transforming the input signal in a non-linear manner to form an output signal; (c) sampling a portion of the output signal to provide a plurality of values relating to a parameter thereof, each at a different time; (d) deriving predistortion information based on the reference type information and the plurality of values ; and (e) predistorting the input signal being provided to the circuit in dependence upon the predistortion information.

In accordance with the invention there is provided A memory circuit for storing data for use with a circuit comprising: a first set of data relating to a reference type information for an input signal being provided to the circuit; a second set of instruction data for sampling a portion of the output signal to provide a plurality of values relating to a parameter thereof, each at a different time; a third set of instruction data for deriving predistortion information based on the reference type information and the plurality of values; and, a fourth set of instruction data for predistorting the input signal being provided to the circuit in dependence upon the predistortion information.

In accordance with the invention there is provided a circuit comprising: a memory circuit for storing a reference type information for an input signal being provided to the circuit; a transforming circuit for transforming the input signal in a non-linear manner to form an output signal; a sampling circuit for sampling a portion of the output signal to provide a plurality of values relating to a parameter thereof, each at a different time; a processor for deriving predistortion information based on the reference type information and the plurality of values; and a predistortion circuit for predistorting the input signal being provided to the circuit in dependence upon the predistortion information.

In accordance with the invention there is provided a method of determining predistortion data for a circuit comprising the steps of: providing a first memory circuit; providing a second memory circuit; providing a reference type information stored in the second memory circuit; providing an input signal to an input port of the circuit; measuring an output type information at an output port of the circuit after having the input signal propagate through the circuit; storing the output type information in the second memory circuit; processing the reference type information and the output type information to derive the predistortion data that defines inverse input output characteristics of the circuit; and, storing at least a portion of the predistortion data in the first memory circuit.

BRIEF DESCRIPTION OF THE DRAWINGS

Exemplary embodiments of the invention will now be described in conjunction with the following drawings, in which:

FIG. 7 illustrates a process for determination of predistortion function for predistorting the input signal of the PA;

FIG. 13 illustrates a process, in accordance with another embodiment of the invention, that is used to calculate the phase predistortion from the histograms of the PA output signal phase;

DETAILED DESCRIPTION THE INVENTION

Figure 1A:
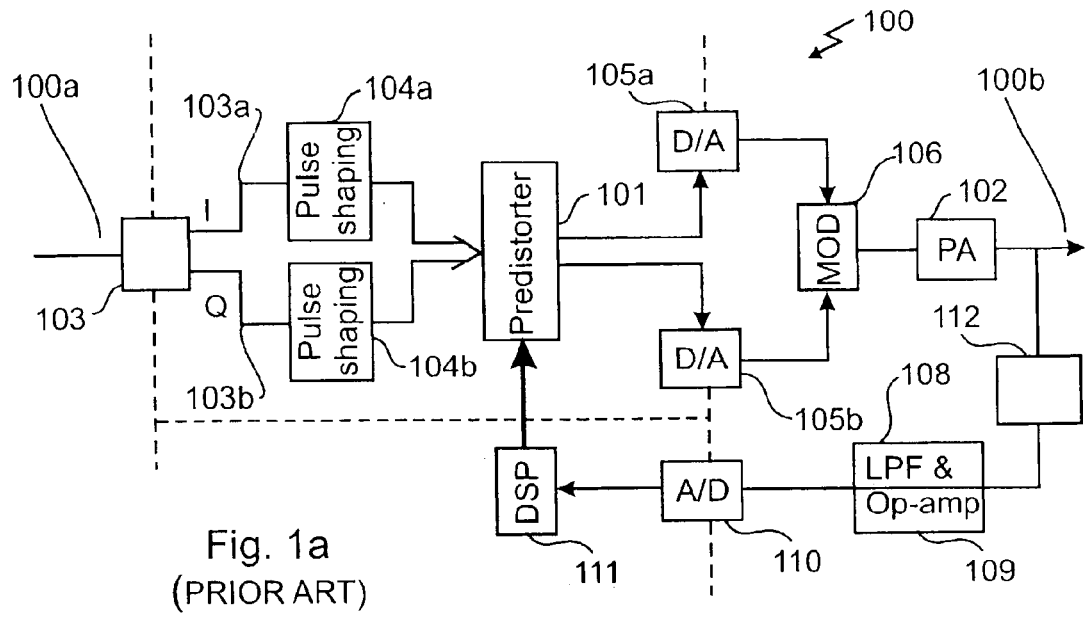
FIG. 1a illustrates a typical RF transmitter circuit having a predistortion circuit that is used to perform AM-AM compensation for non-linear conversion effects of a non-linear circuit, in the form of a power amplifier circuit.
Figure 1B:
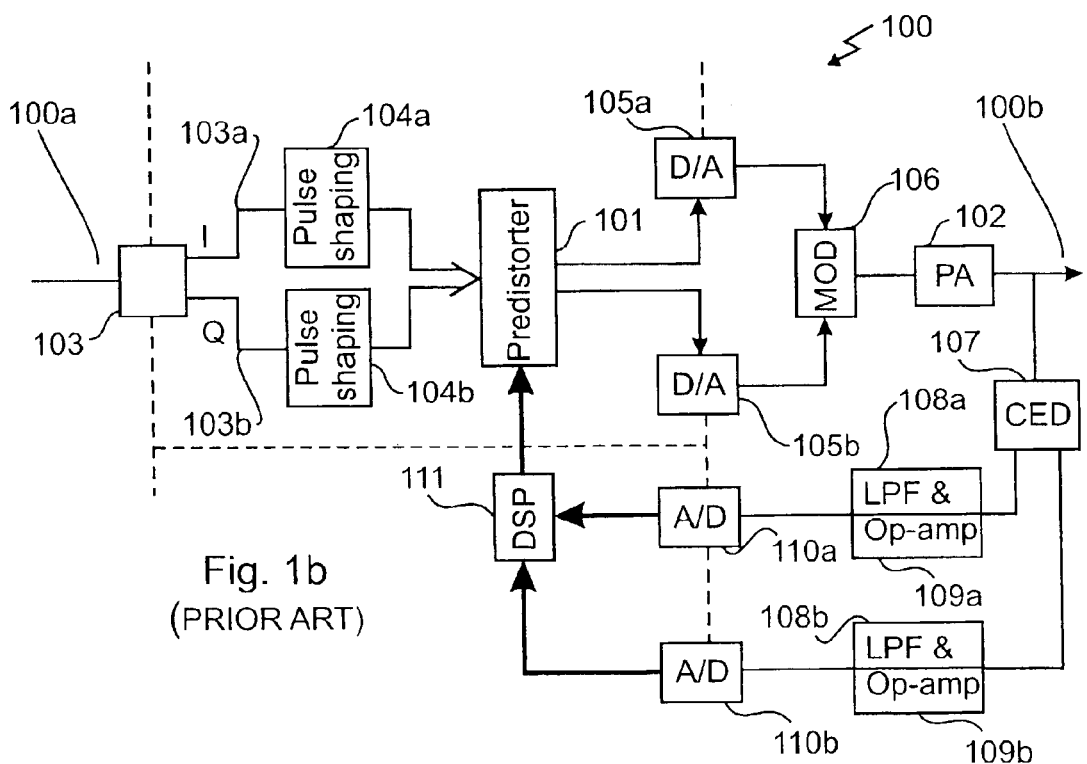
FIG. 1b illustrates a typical RF transmitter circuit having a predistortion circuit that is used to perform AM-AM and/or AM-PM compensation for non-linear conversion effects of a non-linear circuit, in the form of a power amplifier circuit.

FIGS. 1a and 1b each illustrate a typical transmitter circuit 100 having a predistortion circuit 101 that is used to compensate for non-linear conversion effects of a non-linear circuit, in the form of a power amplifier circuit (PA) 102. An input signal in the form of a bit stream is provided to an input port 100a for being received by a mapping circuit 103, having a signal generator disposed therein, used to generate an in-phase (I) symbol at a first output port 103a and a quadrature (Q) symbol at a second output port 103b thereof. Pulse shaping circuits 104a and 104b are connected to output ports 103a and 103b, respectively, for receiving the I and Q symbols and for pulse shaping thereof. The I and Q pulse shaped signals are provided to the predistortion circuit 101 for predistortion thereof. After predistortion, each signal is converted from a digital domain to an analog domain using digital to analog (DA) converters (DACs) 105a and 105b. After conversion a modulator circuit 106 receives the DA converted signals. Thereafter the modulated signal is provided to the power amplifier circuit 102, in the form of either a solid state power amplifier circuit (SSPA) or another type of non-linear amplifier circuit. Predistortion information for being provided to the predistortion circuit 101 is derived from an output signal of the PA 102 using an envelope detector circuit 107 connected to an output port 100b of the PA 102.

A circuit that provides an output signal that has amplitude that is not linearly related to the input signal amplitude exhibits AM-AM distortion. A circuit that provides an output signal with a phase shift relative to its input signal phase, where the phase shift is non-linearly related to the input signal amplitude, exhibits AM-PM distortion.

If only AM-AM distortion compensation is to be performed, then a power detector circuit 112 is used to recover the output signal envelope amplitude. If AM-PM distortion compensation is potentially sought in addition to AM-AM, a complex envelope detector circuit (CED) 107 (FIG. 1b) that provides envelope phase and amplitude information is utilized. A power detector 112 (FIG. 1a) has a single output port while a CED 107 (FIG. 1b) has two output ports. Thus, when AM-PM compensation is performed, two LPF's, two OpAmps and potentially two ADC's are utilized. Thus, for AM-PM compensation the CED 107 output signals are provided to anti-aliasing filters (LPF) 108a and 108b and, optionally, operational amplifiers (OpAmps) 109a and 109b followed by potentially two analog-to-digital converters (ADC) 110a and 110b and a digital signal processor (DSP) 111. For AM-AM compensation, a power detector circuit 112 output signal is provided to a single anti-aliasing filter 108, optionally an operational amplifier 109, and a single ADC 110. The DSP 111 provides predistortion coefficients to the predistortion circuit 101 for predistortion of the pulse shaped I and Q signals, thus closing a feedback path from the output port 100b.

For analysis purposes, the PA 102 is modeled as follows. A carrier-modulated input signal having a complex envelope is denoted by (1), where:

$$x(t)=a(t)e^{j\phi(t)} \quad (1)$$

The PA is a memoryless device, thus the output signal of the PA is expressed as:

$$y(t)=G(a(t))e^{j(\phi(t)+\Phi(a(t)))} \quad (2)$$

In Equations (1) and (2), a(t) is the amplitude of the input signal and $\phi(t)$ is the phase of the input signal. $G(a(t))$ is the amplitude response of the PA, otherwise known as AM-AM conversion, and $\Phi(a(t))$ is the phase response, otherwise known as AM-PM conversion, of the PA. As found in the publication: A.Saleh, "Frequency-independent and frequency-dependent non-linear models of TWT amplifiers", IEEE Trans. On Communications, Vol.29, No. 11, November 1981, incorporated herein by reference, $G(a(t))$ and $\Phi(a(t))$ are generally modeled as:

$$G(a(t)) = \frac{\alpha_o a(t)}{1+\beta_\alpha a^2(t)} \quad (3)$$

$$\Phi(a(t)) = \frac{\alpha_\phi a^2(t)}{1+\beta_\phi a^2(t)} \quad (4)$$

For a small input signal to the PA $G(a(t))$ and $\Phi(a(t))$ are expressed as:

$$G(a(t)) \approx \alpha_o a(t)$$

$$\Phi(a(t)) \approx 0$$

where the PA performs linear amplification and its phase conversion is negligible.

For a large input signal, $G(a(t))$ and $\Phi(a(t))$ are expressed as:

$$G(a(t)) \Rightarrow \frac{\alpha_o}{\beta_\alpha a(t)}$$

$$\Phi(a(t)) \Rightarrow \frac{\alpha_\phi}{\beta_\phi}$$

From the PA model of Equation 2, the gain and phase response of the PA are separable. Thus, the gain response and the phase response are treated separately, thereby simplifying the process of PA non-linear distortion compensation.

Figure 2A:
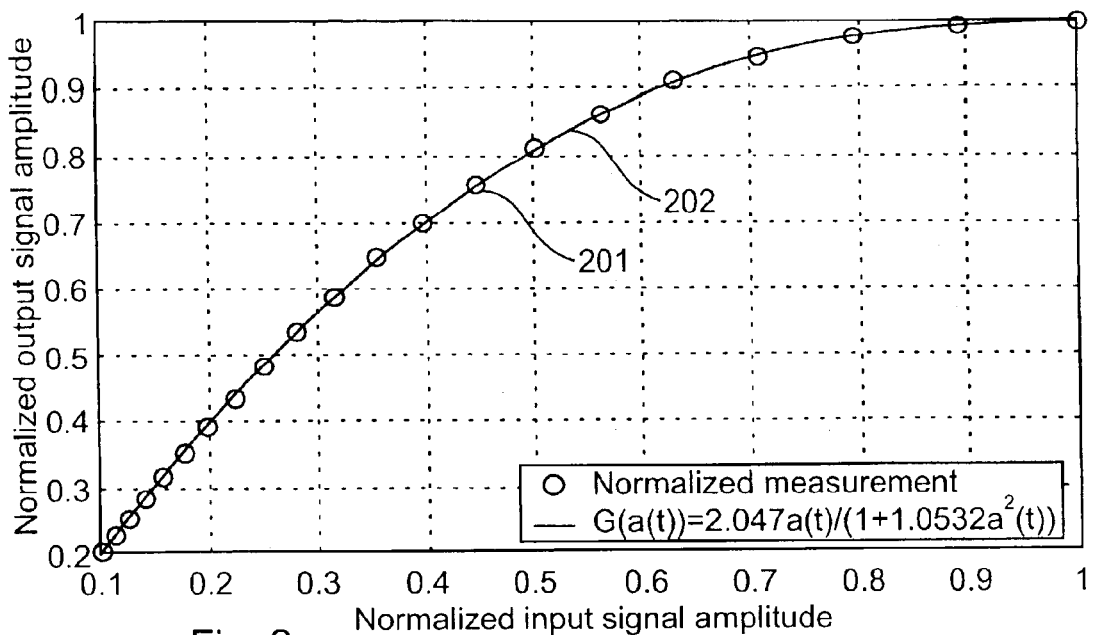
FIG. 2a illustrates a graph of normalized input signal amplitude vs. normalized output signal amplitude.

FIG. 2a illustrates a graph of normalized input signal amplitude vs. normalize output signal amplitude. The graph has a first set of data points that represent the measured amplitude response 201 of the PA along with a plot of a continuous function representing the least-squares fit equation 202 for the first set of data points. The least squares fit equation results in the following for Equation (5):

$$G(a(t)) = \frac{2.047a(t)}{1+1.0532a^2(t)} \quad (5)$$

Figure 2B:
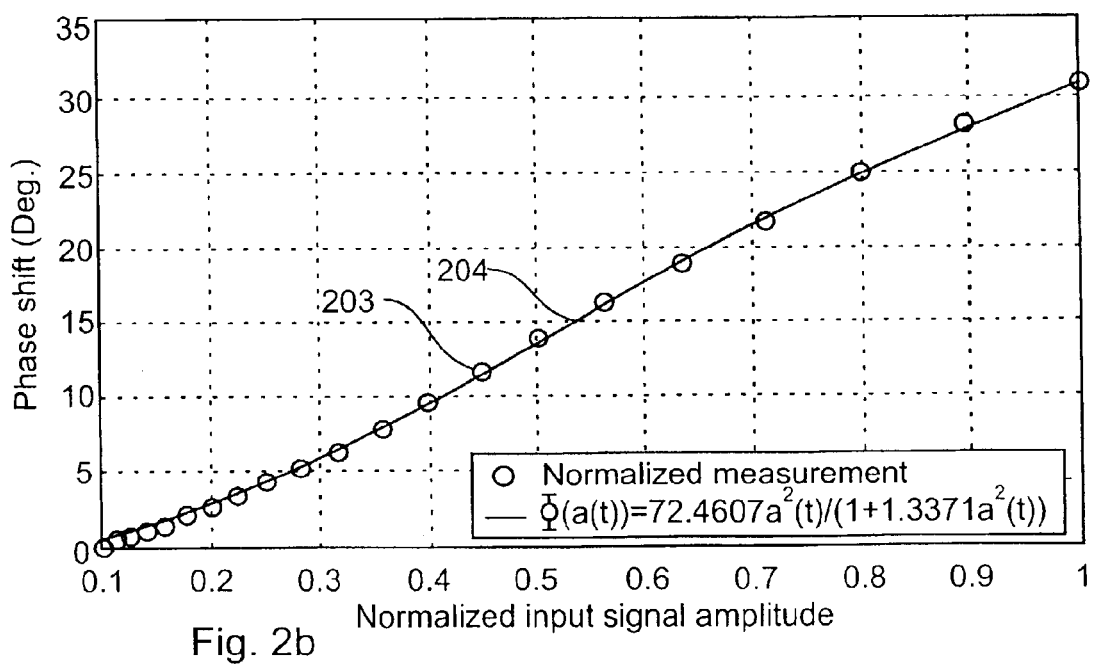
FIG. 2b illustrates a graph of normalized input signal amplitude vs. output signal phase shift in degrees.

FIG. 2b illustrates a graph of normalized input signal amplitude vs. output signal phase shift in degrees. The graph has a first set of data points representing a measured phase response 203 of the PA along with a plot of a continuous least-squares fit equation 204 for $\Phi(a(t))$. The least squares fit equation results in the following Equation (6):

$$\Phi(a(t)) = \frac{72.4607a^2(t)}{1+1.3371a^2(t)} \quad (6)$$

FIGS. 2a and 2b illustrate a close match between the modeled and measured amplitude and phase responses of the PA.

"Type" is a term used in information theory for a histogram estimate of a discrete probability density function as is found in the text of T. Cover and J. Thomas, Elements of information theory, John Wiley & Sons, Inc., New York, 1991, pp. 279–335, incorporated herein by reference. Type information describes the statistical property of a time series, where cumulative distribution function (CDF) and probability density function (PDF) are examples thereof.

AM-AM conversion and AM-PM conversion are considered separately for the PA due to their separability. Thus, when considering of AM-AM conversion distortion, $\Phi(a(t))=0$ is assumed without loss of generality.

Figure 3:
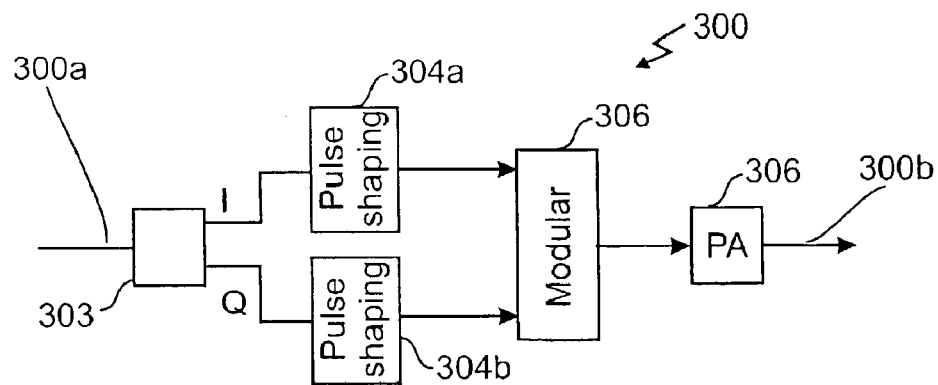
FIG. 3 illustrates a block diagram of a typical transmitter apparatus absent a predistortion circuit.

FIG. 3 illustrates a block diagram of a typical transmitter apparatus 300, absent a predistortion circuit, in which an input signal, in the form of an input bit stream, is provided to an input port 300a of a mapping circuit 303 for being split into two symbol streams. One symbol stream is termed the in-phase (I) component, and the other the quadrature (Q) component. Two pulse-shaping filters 304a and 304b are used to pulse-shape the I and Q components before they are modulated onto a carrier signal by a modulator circuit 306 that includes a frequency up-conversion circuit used to convert the signal to a predetermined transmission frequency for transmission. The PA 302 amplifies the modulated carrier signal before transmission from an output port 300b of the typical transmitter apparatus. Two commonly used pulse-shaping filters 304a and 304b are square-root raised-cosine (SQRC) filters and Gaussian filters.

After modulation, the signal is provided to the PA 302 and thus a pulse-shaped and carrier-modulated signal results, where the envelope of this signal encodes specific type information. When this signal propagates through the PA 302, the AM-AM conversion of the PA 302 distorts the input type information and more specifically the input signal envelope amplitude. In order to reduce the distortion of the envelope amplitude a predistorter 101 (as shown in prior art FIG. 1) is utilized to predistort the input signal provided to the PA. The design of an amplitude predistorter is typically based on the output signal type information, in the form of a CDF, as discussed hereinbelow.

Figure 4:
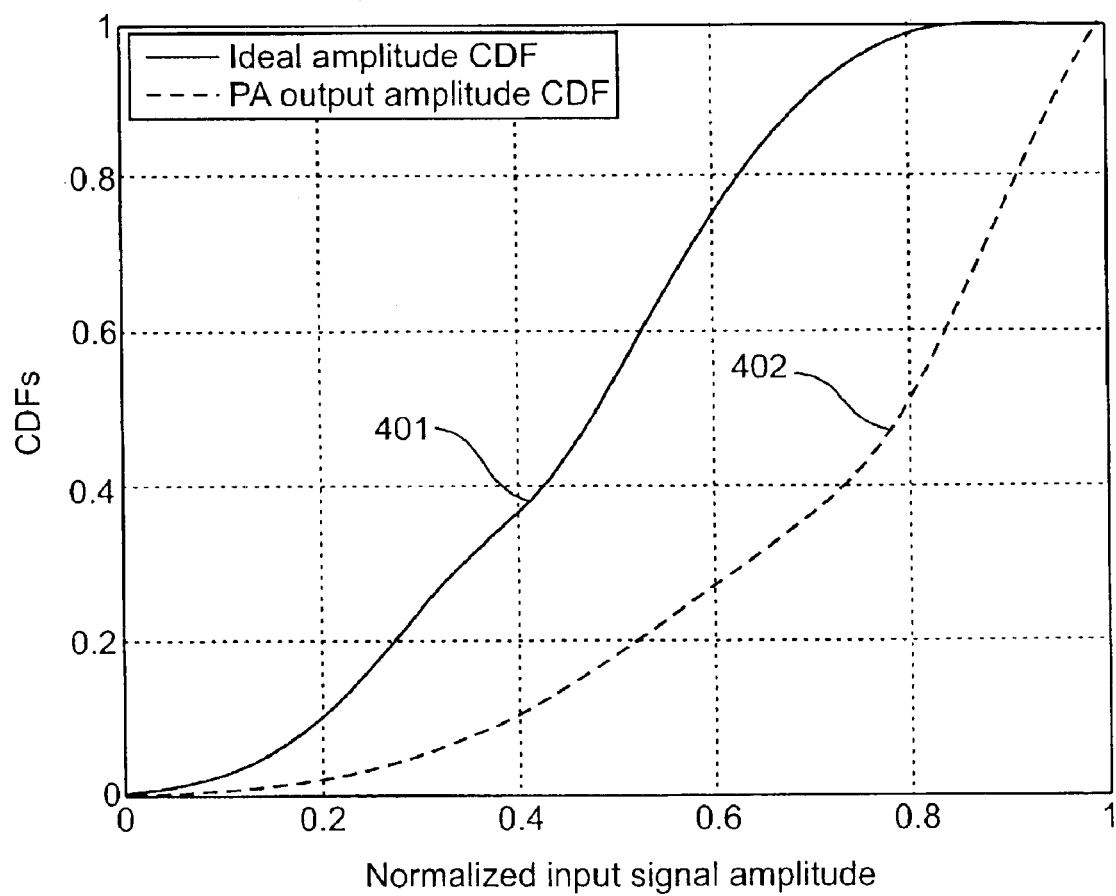
FIG. 4 illustrates a graph of the CDF vs. normalized input signal amplitude.

FIG. 4 illustrates a graph of the CDF vs. normalized input signal amplitude. A reference amplitude CDF is generated using $G(a(t))=a(t)$ for an ideally linearly amplified signal. A PA output amplitude CDF 402, calculated from the output of the PA whose characteristics is defined by Equation (5), is also plotted on the graph. These curves 401 and 402 plotted on this graph are generated by providing the transmitter circuit (FIG. 3) with a 10000 random input bit sequence, where the CDF's are derived using computer simulations of a 16-QAM transmitter using pulse-shaping filters in the form of two square-root raised cosine (SQRC) filters, each having a roll-off factor of 0.35. The AM-AM conversion model of Equation (5) is used to generate the non-linear PA output signal, and the input back-off (IBO) is 6 dB corresponding to the peak-to-average power ratio for modulation and filtering. From the graph of FIG. 4 the effects of the PA's AM-AM non-linearity on the CDF are evident. A difference between the reference CDF 401 and the actual PA output CDF 402 are used in determination of an amount of predistorting to compensate for the effects of the PA non-linearity.

The actual PA output CDF is denoted by $P_A(a)$ 402, and the reference CDF is denoted by $P_1(a)$ 401, where a denotes the input signal envelope amplitude 501 at a point along the output CDF 402. For convenience, time-dependence is not included in the denotation. As is observed in FIG. 5, for a given input signal envelope amplitude a 502, there exists a value y 501 on the reference CDF 401, that satisfies Equation (7), where:

$$P_1(y) = P_A(a) \qquad (7)$$

Given that the input-output characteristic of the PA is a monotonically increasing and continuous function up to the PA saturation point, both $P_1(\cdot)$ and $P_A(\cdot)$ are thus continuous and invertable functions. Therefore, y is expressed as:

$$y = P_1^{-1}(P_A(a)) \qquad (8)$$

where $$P_1^{-1}(\cdot)$$

denotes the inverse function of $P_1(\cdot)$.

Equation (8) defines the predistorter operation whose input and output values are a 502 and y 501, respectively. The operation of the predistorter is illustrated in a graph of FIG. 5.

Figure 5:
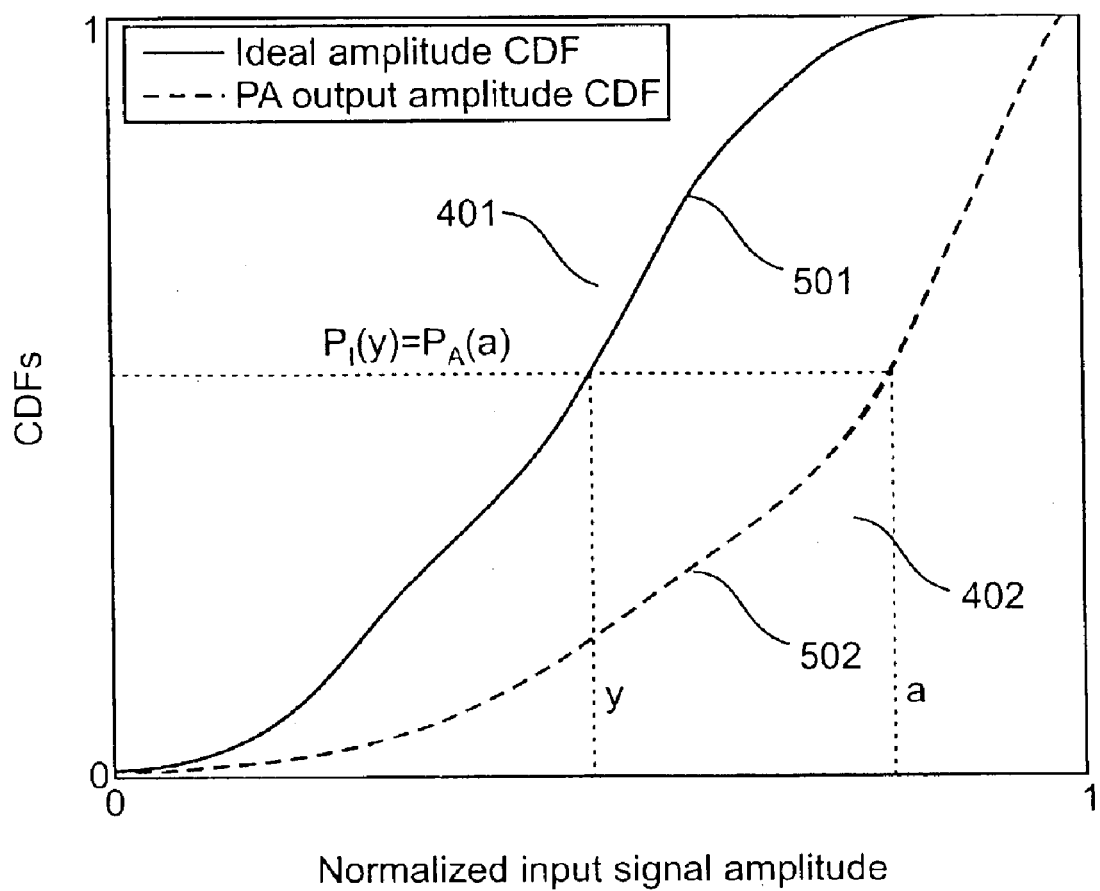
FIG. 5 illustrates the mapping to restore a corresponding value of the PA output CDF to that of a reference CDF.
Figure 6:
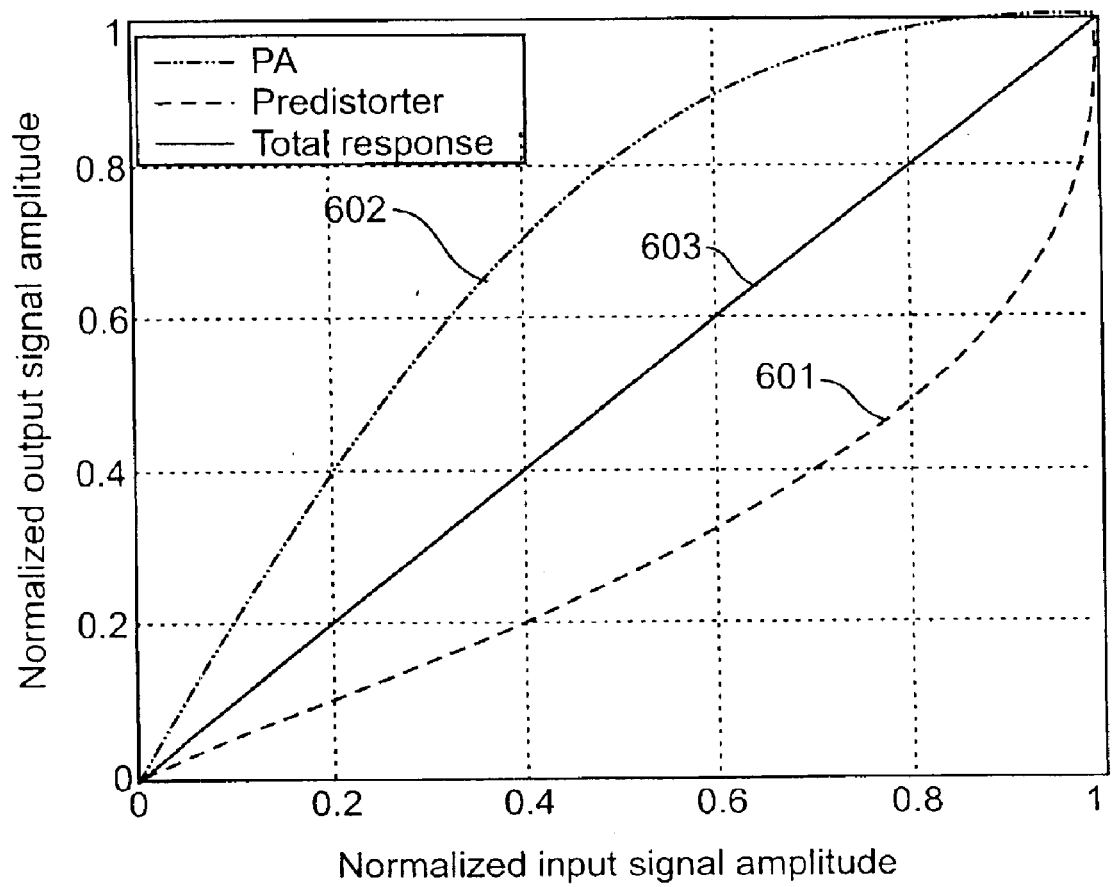
FIG. 6 illustrates a graph showing normalized output signal amplitude vs. normalized input signal amplitude.

From FIG. 5 it is observed that for any given input value a 502 along the output CDF 402, to restore the corresponding value of the PA output CDF 402 to that of the reference CDF 401, mapping toy 501 is performed. This mapping is non-linear, and it depends on the input value a 502. FIG. 6 illustrates a graph showing normalized output signal amplitude vs. normalized input signal amplitude. Three curves are plotted on this graph, the characteristics of the predistorter 601, the PA characteristic 602 and the combined characteristic of the predistorter and the PA characteristic 603. If the input signal to the PA is predistorted in accordance with Equation (8), the non-linear AM-AM effect of the PA is removed up to the saturation point of the PA.

For determination of predistortion data for predistorting the input signal of the PA, a process illustrated in FIG. 7 is utilized, in accordance with an embodiment of the invention. For this process both the reference CDF and the PA output CDF are stored in a memory circuit, with each having N data points. The reference CDF and the PA output CDF are denoted by $P_1(a_n)$ and $P_A(a_n)$, respectively, for n=1,2, ..., N, where $a_n=(n-1)/(N-1)$ represents a normalized input envelope level from 0 to 1, inclusive. The process depicted in FIG. 7 shows steps for computing of the input-output characteristic of the predistorter, where input and output data provided to the predistorter are denoted as $x_n$ and $y_n$, respectively.

Upon completion of the process shown in FIG. 7, data pairs $(x_n, y_n)$ (n=1,2, ..., N) are provided that define the input-output characteristic of the predistorter. Although these data pairs are not in the form of an analytical expression, they are readily implementable in conjunction with a look-up table (LUT) 1420 (FIG. 14) for use with the PA 1402 (FIG. 14). The LUT facilitates updating of data stored therein when a new $y_n$ is determined for the PA.

If compensating for AM-PM distortion for the PA is also preferable, a technique is outlined hereinbelow for compensating the AM-PM non-linear conversion of a PA, in accordance with another embodiment of the invention. The AM-PM predistortion is derived using a 2-dimensional histogram of the PA output signal envelope phase and that of its input signal envelope phase.

The PA output signal envelope phase is more complex than its envelope amplitude, since the envelope phase depends on both the input signal amplitude and input signal phase. To examine the effects of the AM-PM distortion, a 2-dimensional histogram of the PA's output signal envelope phase versus its input signal amplitude and phase is evaluated. The following notation is utilized hereinbelow to facilitate the evaluation.

1. $h(\phi, a)$: The joint histogram of the linear amplifier output phase as a function of the input signal phase $\phi$ and input signal amplitude a;
2. $h_d(\phi, a)$: The histogram of the PA output phase as a function of the input signal phase $\phi$ and input signal amplitude a;
3. $h(\phi/a=a_m)$: The conditional histogram of the linear amplifier output phase as a function of the input signal phase $\phi$ for a given input signal amplitude $a_m$;
4. $h_d((\phi/a=a_m)$: The conditional histogram of the PA output phase as a function of the input signal phase $\Phi$ for a given input signal amplitude $a_m$.

Figure 8A:
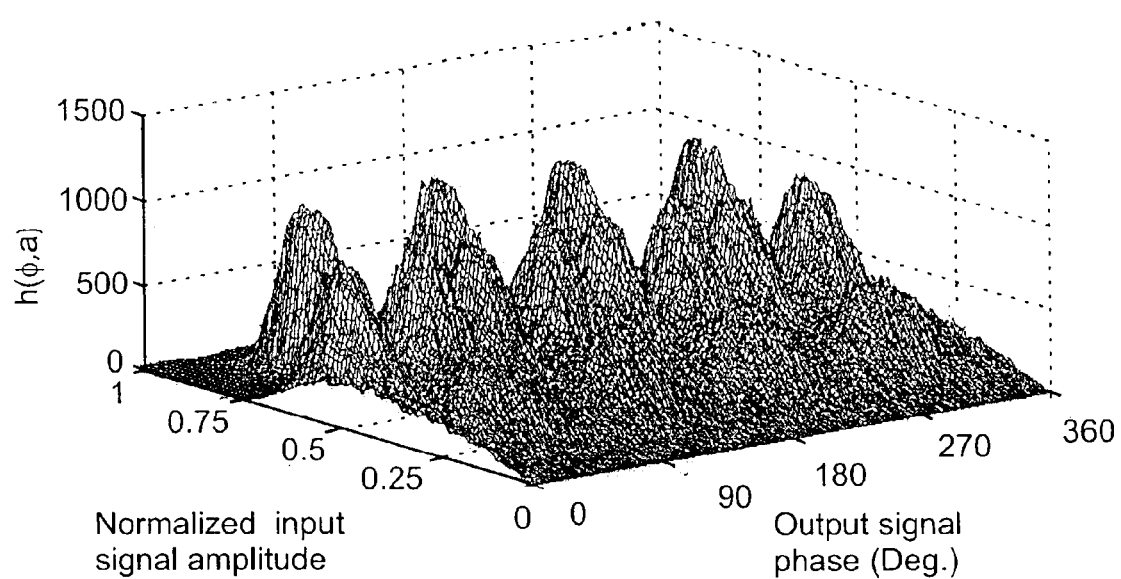
FIGS. 8a and 8b illustrate examples of 2-dimensional histograms from a 16-QAM modulated transmission system used with a SQRC pulse-shaping filter of a linear amplifier output phase and a nonlinear amplifier output phase, respectively.
Figure 8B:
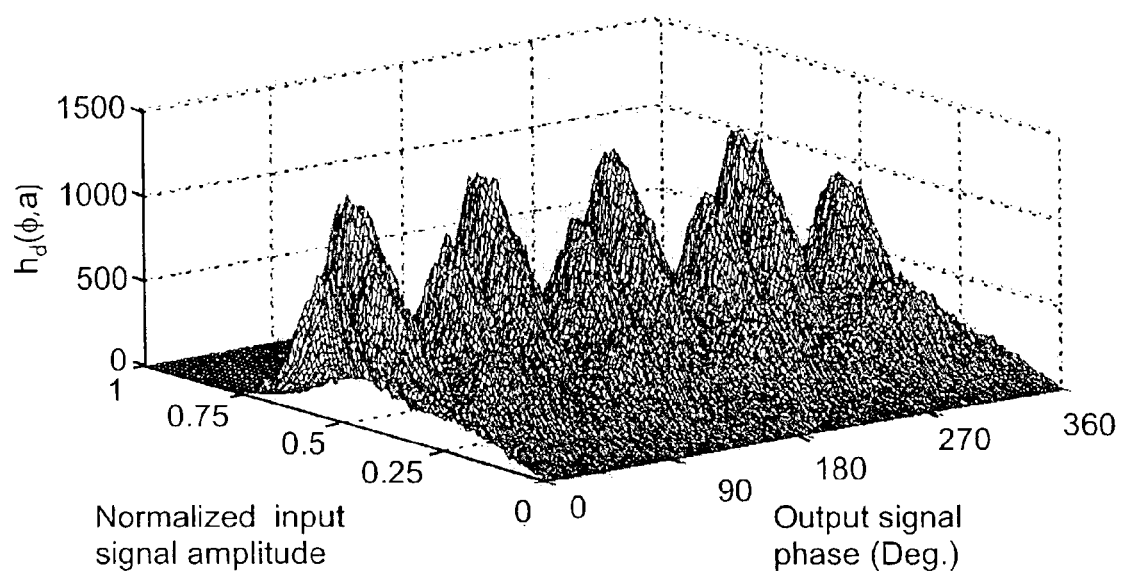

FIGS. 8a and 8b illustrate examples of 2-dimensional histograms, $h(\Phi, a)$ and $h_d(\phi, a)$ from a 16-QAM modulated transmission system used with a SQRC pulse-shaping filter. FIG. 8a illustrates $h(\phi, a)$ in relation to a normalized PA input signal amplitude and PA output signal phase, while FIG. 8b illustrates $h_d(\phi, a)$ in relation to a normalized PA input signal amplitude and PA output signal phase. Although the phase distortion due to the AM-PM conversion is noticeable in these 3-D plots for a large normalized input signal amplitude as it approaches 1, it is difficult to quantify such a distortion.

Figure 9A:
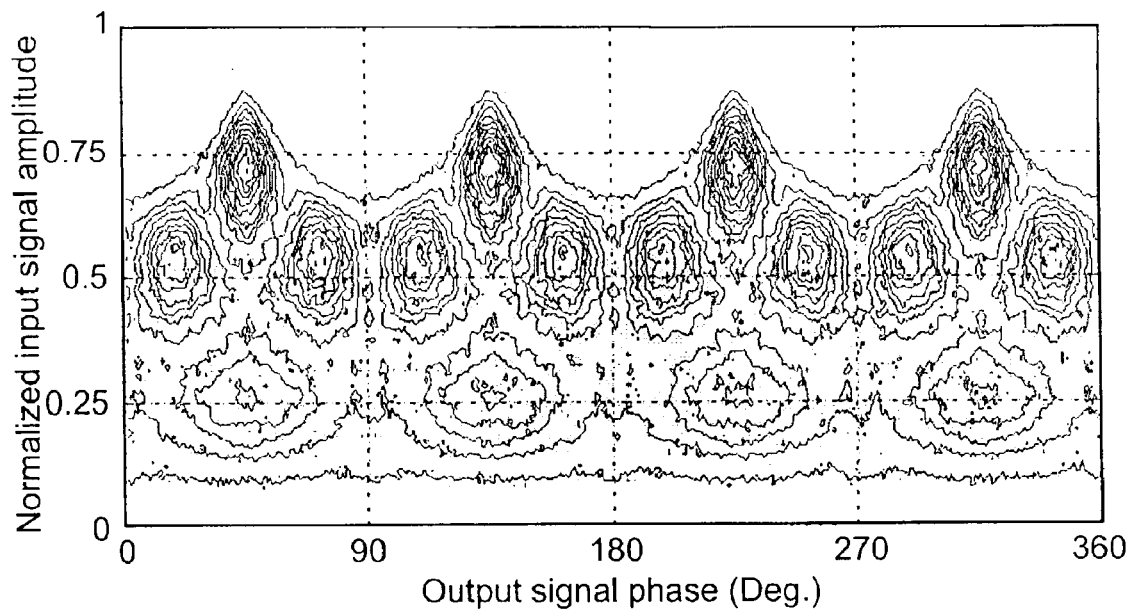
FIG. 9a illustrates contours representing the result of the linear amplification in terms of normalized PA input signal amplitude vs. the PA output signal phase.
Figure 9B:
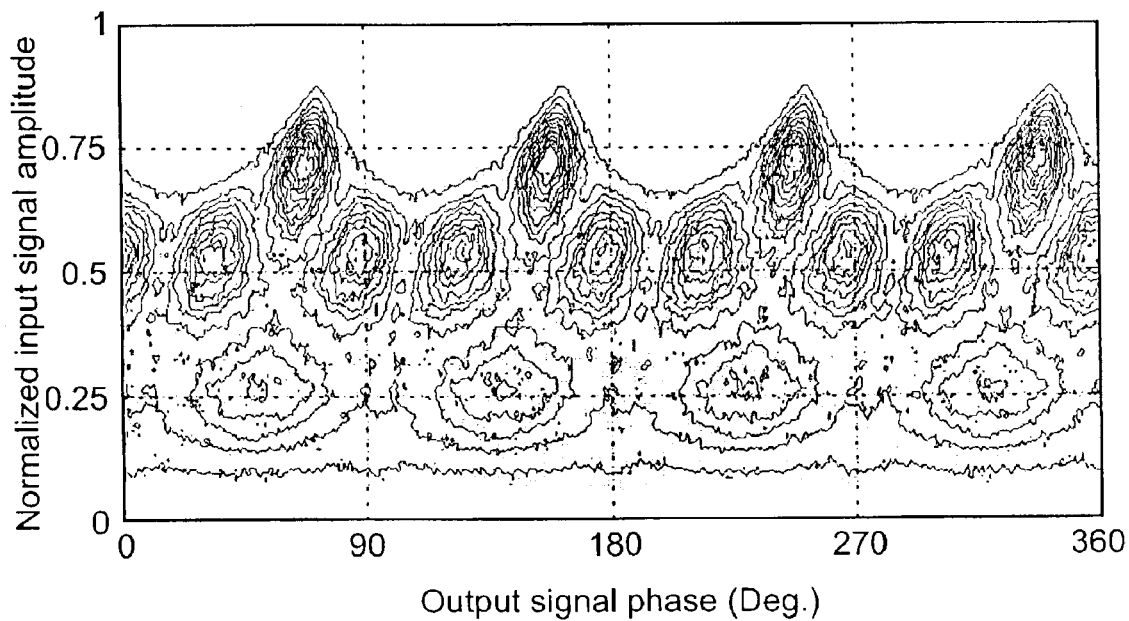
FIG. 9b illustrates contours representing the result of the nonlinear amplification in terms of the normalized PA input signal amplitude vs. the PA output signal phase.

In order to better illustrate effects of the AM-PM distortion, the contours of the histograms in FIGS. 8a and 8b are plotted in FIGS. 9a and 9b, respectively. FIG. 9a illustrates contours representing the result of the linear amplification in terms of normalized PA input signal amplitude vs. the PA output signal phase, and FIG. 9b illustrates contours representing the normalized PA input signal amplitude vs. the PA output signal phase. As is shown in FIG. 9b, the AM-PM conversion of the PA distorts the output phase histogram, thus shifting the output signal phase towards higher degrees of phase, or to the "right." As a result, the larger the PA input signal amplitude, the more the histogram deviates from its expected—unshifted—position. Due to the periodicity of the PA output signal phase, the AM-PM distortion causes the phase near 360° to wrap around and to appear near 0°.

Figure 10:
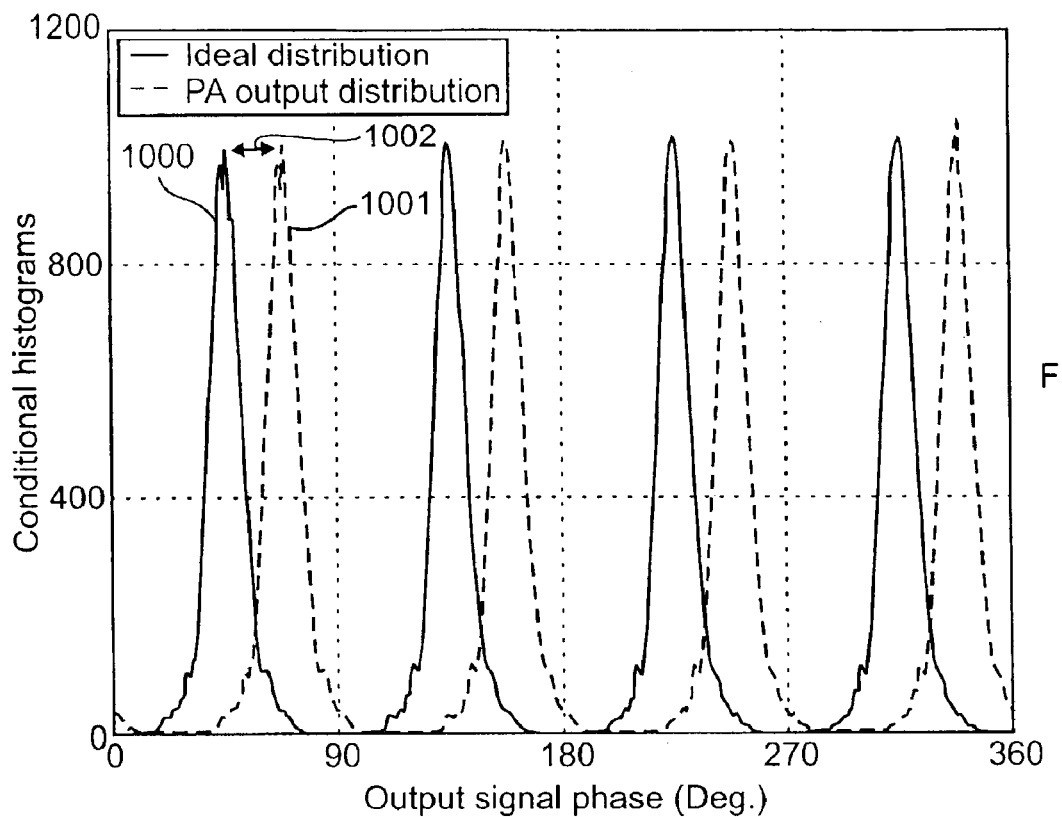
FIG. 10 illustrates a phase shift difference between a reference conditional histogram and a PA output conditional histogram.

For a given PA input signal amplitude, the amount of histogram shift is determined by the AM-PM distortion. For example, if the input signal amplitude is fixed at $a_m$, and the conditional histograms are graphed against the input signal phase, such that $h(\phi/a=a_m)$ 1000 and $h_d(\phi/a=a_m)$ 1001 are plotted versus $\phi$ (FIG. 10), then the amount of phase shift 1002 is observed between the reference conditional histogram 1000 and the output conditional histogram 1001. Referring to FIG. 10, the input signal amplitude $a_m$ has a value of 0.75.

To derive the phase predistortion information, a calculation of the amount of phase shift is performed. This amount of phase shift is that which is to be compensated for in designing of a phase predistorter to predistort the phase of the input signal to the PA.

The difference between the reference phase histogram (FIG. 9a) and the PA output phase histogram (FIG. 9b) provides information used in designing and/or implementing of the predistorter to compensate for the effects of the AM-PM conversion.

It follows from FIG. 10 that in order to find the amount of phase shift of $h_d(\Phi/a=a_m)$, which denotes the amount of the output signal phase shift caused by the input signal amplitude $a_m$, conditional histograms $h(\Phi/a=a_m)$ and $h_d(\phi/a=a_m)$ are treated as two 1-dimensional processes, where their cross-correlation is calculated as follows:

$$r(\Delta\varphi \mid a = a_m) = \int_0^{2\pi} h(\varphi \mid a = a_m) h_d(\varphi - \Delta\varphi \mid a = a_m) d\varphi \qquad (9)$$

where $r(\Delta\Phi/a=a_m)$ denotes the cross-correlation function for a given PA input signal amplitude $a_m$. The cross-correlation of Equation (9) reaches a maximum value when $h(\phi/a=a_m)$ and $h_d(\phi/a=a_m)$ overlap. When this occurs, the value of $\Delta\phi$ represents the AM-PM conversion at the PA input condition where $a=a_m$. That is, $$\phi_{m-argmax}\{r(\Delta\phi|a=a_m)\} \qquad (10)$$

Figure 11:
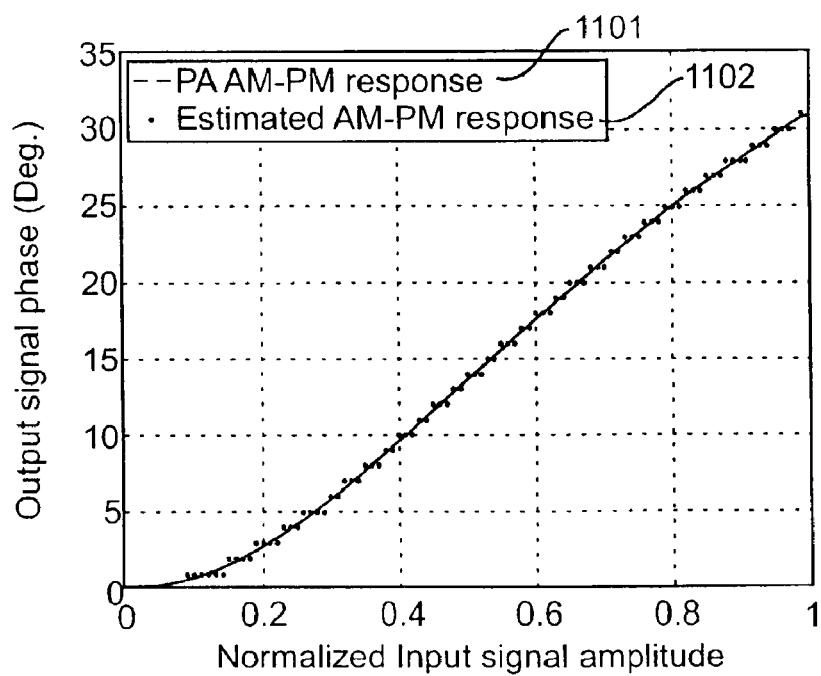
FIG. 11 illustrates a graph of PA output signal phase shift vs. normalized input signal amplitude, having plotted thereon a first set of data representing an actual AM-PM conversion and a second set of data representing an estimated AM-PM conversion.
Figure 12:
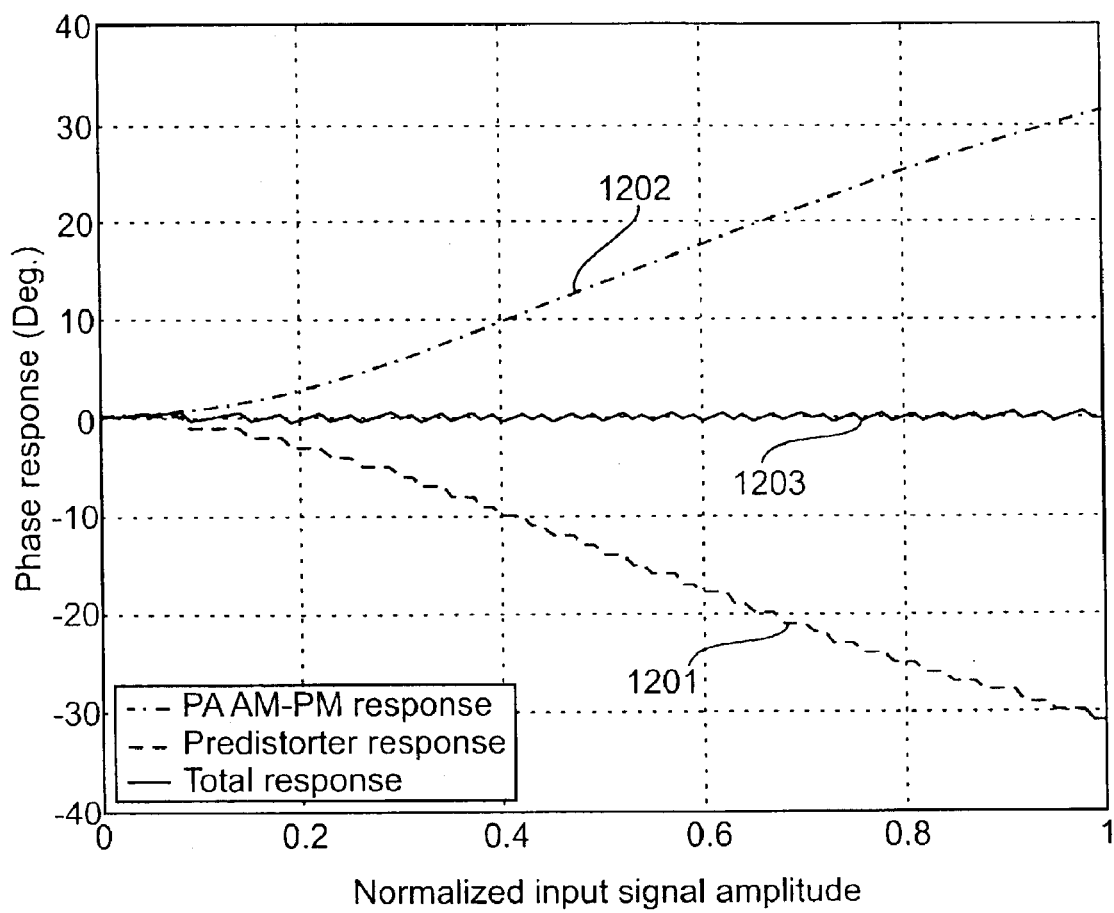
FIG. 12 illustrates a graph of the output signal phase shift vs. normalized input signal amplitude, where the phase response of the predistorter, the PA phase response and the total combined predistorter phase response and PA phase response are plotted.

Equation (9) performs a cyclic correlation due to the periodicity of $h_d(\phi/a=a_m)$. As an example, FIG. 11 illustrates a graph of PA output signal phase shift due to the AM-PM conversion, having plotted thereon a first set of data representing an actual AM-PM conversion 1101 and a second set of data representing an estimated AM-PM conversion 1102 using the aforementioned process. In generating the data for the cross correlation, a phase increment of 1 degree is used, which yields a maximum absolute error of 0.5 degrees. From this graph it is evident that the estimated AM-PM conversion accurately represents the actual AM-PM conversion, and the small deviations are due to the step size of the phase increment. Given the estimated AM-PM conversion, the input signal phase is predistorted at baseband prior to being provided to the modulator and PA. FIG. 12 illustrates a graph of the AM-PM conversion, where the phase response of the predistorter 1201, the PA phase response 1202 and the total combined predistorter phase response and PA phase response 1203 are plotted. From this graph it is evident that the phase distortion resulting from the PA's AM-PM conversion is significantly reduced 1203. A small fluctuation, or residual error, of the total PA combined response 1203 is due to the 1-degree phase increment used in calculating of $h(\phi,a)$ and $h_d(\phi, a)$, which is no more than one half of the phase increment. Advantageously, reducing of the phase increment effectively reduces such a residual error.

A process, in accordance with another embodiment of the invention, used to calculate the phase predistortion from the histograms of the PA output signal phase, is illustrated in FIG. 13. For this process to operate, both the reference phase histogram and the PA output signal histogram are stored in a memory circuit, with each having M×N data points, where M is number of discrete phase data points. These data points are denoted by $h(\phi_m,a_n)$ and $h_d(\phi_m,a_n)$, respectively, for m=1,2, ... , M, and n=1,2, ... , N, where $a_n=(n-1)/(N-1)$ represents the normalized input signal amplitude envelope level from 0 to 1 inclusive, and $\phi_m=360°\times(m-1)/M$. For the process shown in FIG. 13, input data and output data are denoted by $u_n$ and $v_n$, respectively, for computation of the input-output characteristic of the phase predistorter.

Upon completion of this process, data pairs $(u_n,v_n)$ (n=1, 2, ... , N) are provided that define the input-output characteristic of the phase predistorter. Although these data pairs are not in a closed-form functional expression, a LUT is provided for storage thereof.

Figure 14A:
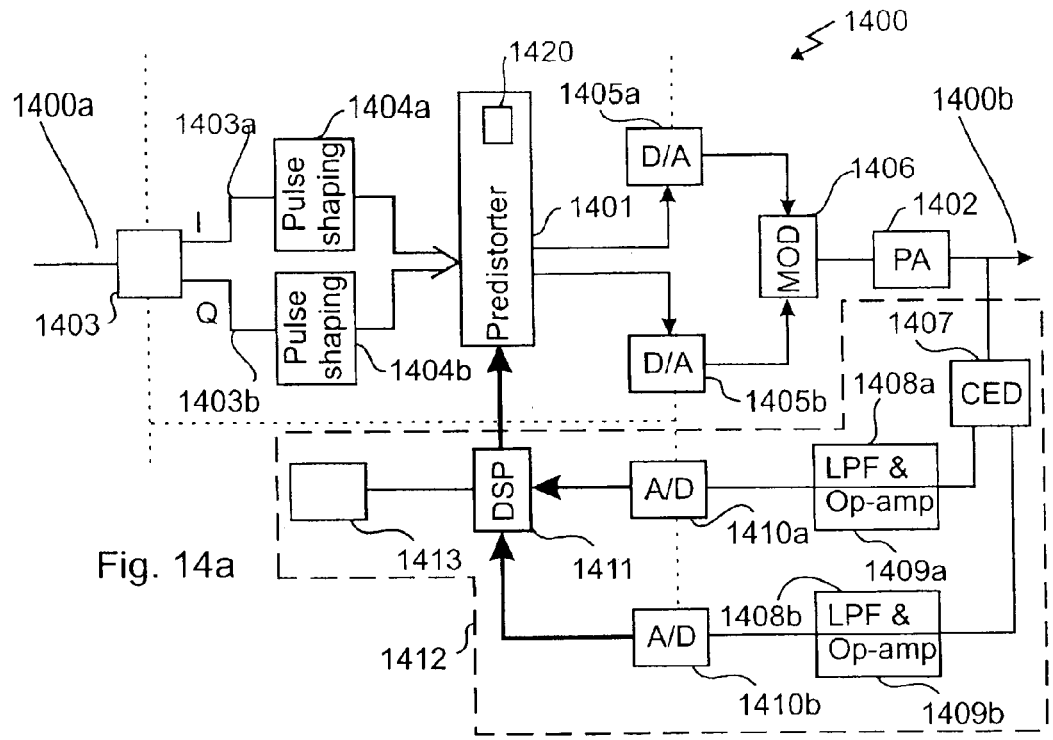
FIG. 14a illustrates another embodiment of the invention, a transmitter circuit employing a predistortion circuit and a complex envelope detector circuit for compensating for AM-AM and/or AM-PM signal distortion.

FIG. 14a illustrates another embodiment of the invention, a transmitter circuit 1400 employing a predistortion circuit that comprises a LUT 1420 in conjunction with a memory circuit 1413 for storing of instruction data encoding the processes shown in FIGS. 7 and 13. An input signal for transmission is provided to an input port 1400a, to which is coupled a mapping circuit 1403 that is used to generate an in-phase (I) symbol at a first port 1403a and a quadrature symbol (Q) at a second port 1403b. Pulse shaping circuits 1404a and 1404b are connected to ports 1403a and 1403b for receiving the I and Q symbols and for pulse shaping thereof. The I and Q pulse shaped signals are provided to the predistortion circuit 1401 comprising a LUT 1420 for predistortion thereof. After predistortion, in accordance with embodiments of the invention, each signal is converted from a digital domain to an analog domain using DA converters 1405a and 1405b. After conversion the modulating signals are received by a modulator circuit 1406, thereafter the signal is provided to the power amplifier circuit 1402. Predistortion information for this PA 1402 is derived from an output signal of the PA 1402 using a linearizer circuit 1412 connected to an output port 1400b of the transmitter circuit 1400. Optionally, a memory circuit 1413 disposed within the linearizer 1412 circuit and external to the DSP 1411 is provided for storing therein instruction data for being read by the DSP 1411 for providing predistortion information to the predistorter 1401. Of course, some DSPs have internal memory circuits and in such cases instruction data for being read by the DSP are stored within the DSP.

The linearizer circuit 1412 for use with AM-AM and AM-PM compensation is comprised of a complex envelope detector 1407, two anti-aliasing filters in the form of a LPFs 1408a and 1408b and optionally two operational amplifiers (OpAmps) 1409a and 1409b, two analog-to-digital (A/D) converters 1410a and 1410b and a digital signal processor (DSP) 1411 to calculate the predistortion coefficients or predistortion data for storing thereof in the LUT 1420 during a preferably continuous calibration, the continuous calibration other than inhibiting operation of the transmitter. In a variation of this embodiment shown in FIG. 14b, a power detector 1416 is disposed for use in AM-AM compensation only, where a single output signal is provided therefrom. Thus, the linearizer circuit 1415 in this case is comprised of a single anti-aliasing filter 1408, optionally a single op-amp 1409, a single ADC 1410 and a DSP 1411. Although these implementations assume a digital baseband predistortion, the technique is easily extendable to address other predistortion architectures.

In the case of AM-AM compensation only, a power detector 1416 (FIG. 14b) is used for obtaining the envelope signal amplitude information. When AM-PM compensation is to be performed, a complex envelope detector (CED) 1407 (FIG. 14a) is utilized to provide output signal envelope phase information, optionally in addition to the output signal envelope amplitude information.

Figure 14B:
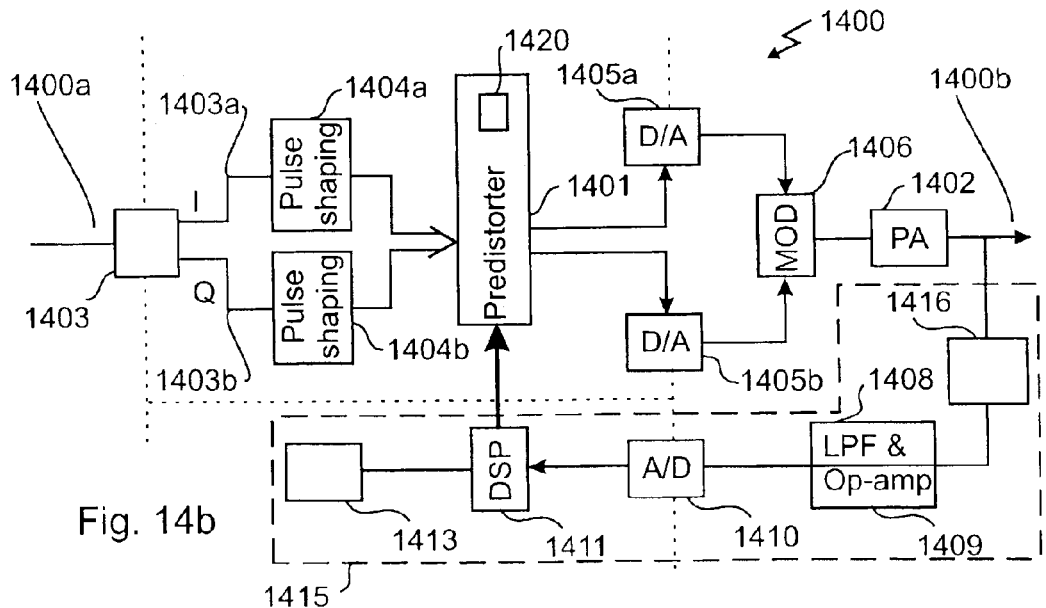
FIG. 14b illustrates another embodiment of the invention, a transmitter circuit employing a predistortion circuit and a power detector circuit for compensating for AM-AM signal distortion.
Figure 14C:
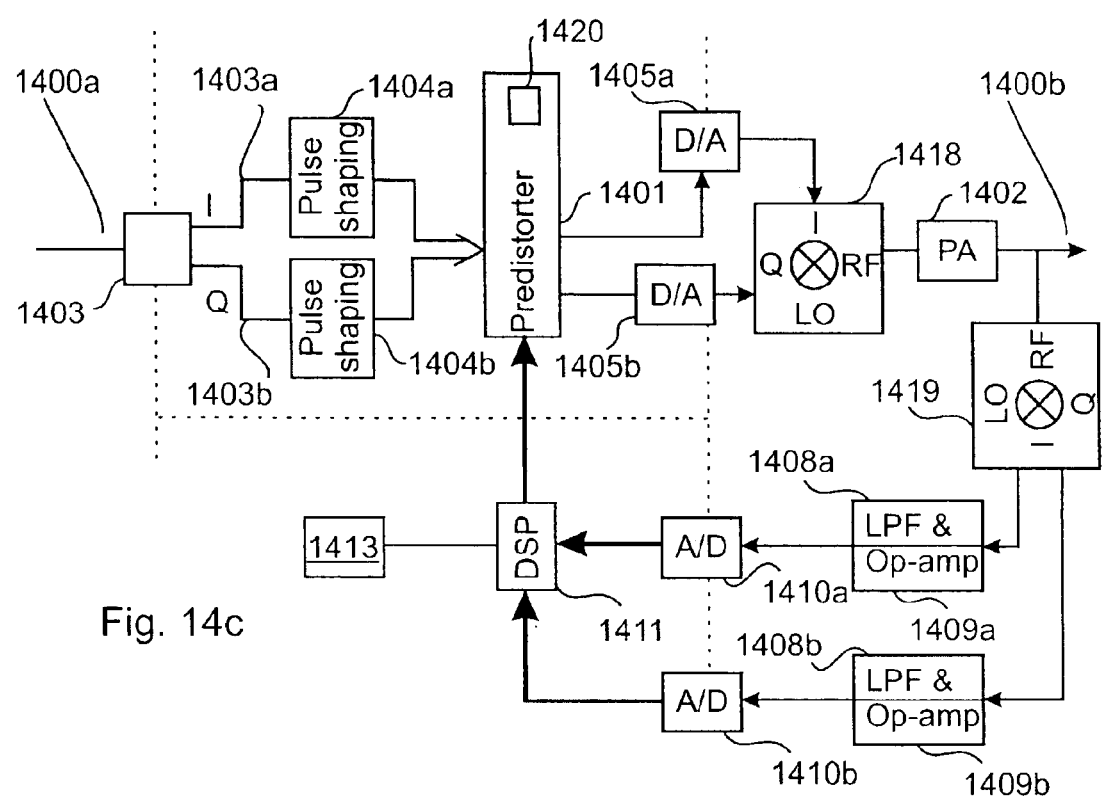
FIG. 14c illustrates another embodiment of the invention, a direct transmitter circuit employing a quadrature demodulator circuit.

One implementation technique for obtaining the output signal envelope amplitude information and output signal envelope phase information is to use a quadrature demodulator 1419, as illustrated in FIG. 14c. This architecture is particularly attractive in a direct transmitter as depicted in the FIG. 14c, where a local oscillator (LO) 1417 is used in the transmit chain to provide a first oscillating signal to a quadrature modulator 1418 to modulate the baseband I and Q signal. The quadrature demodulator 1419 is disposed for receiving a portion of the output signal form the output port

1400*b* and for receiving a same oscillating signal from the LO 1417. For sampling the I and Q output signals from the output ports of the quadrature demodulator 1419, two LPFs 1408*a* and 1408*b*, optionally two Op-Amps 1409*a* and 1409*b*, and two ADCs 1410*a* and 1410*b* are used to provide input samples into the DSP 1411. Based on this baseband information, output signal envelope amplitude and envelope phase data is generated within the DSP 1411 for storage within the external memory 1413 or within memory disposed within the DSP 1411.

The processes illustrated in FIGS. 7 and 13 are used to derive predistortion data for the AM-AM and AM-PM compensation. This predistortion data is preferably stored in the linearizer circuit 1412 external memory 1413 in electrical communication with the DSP 1411.

Figure 14D:
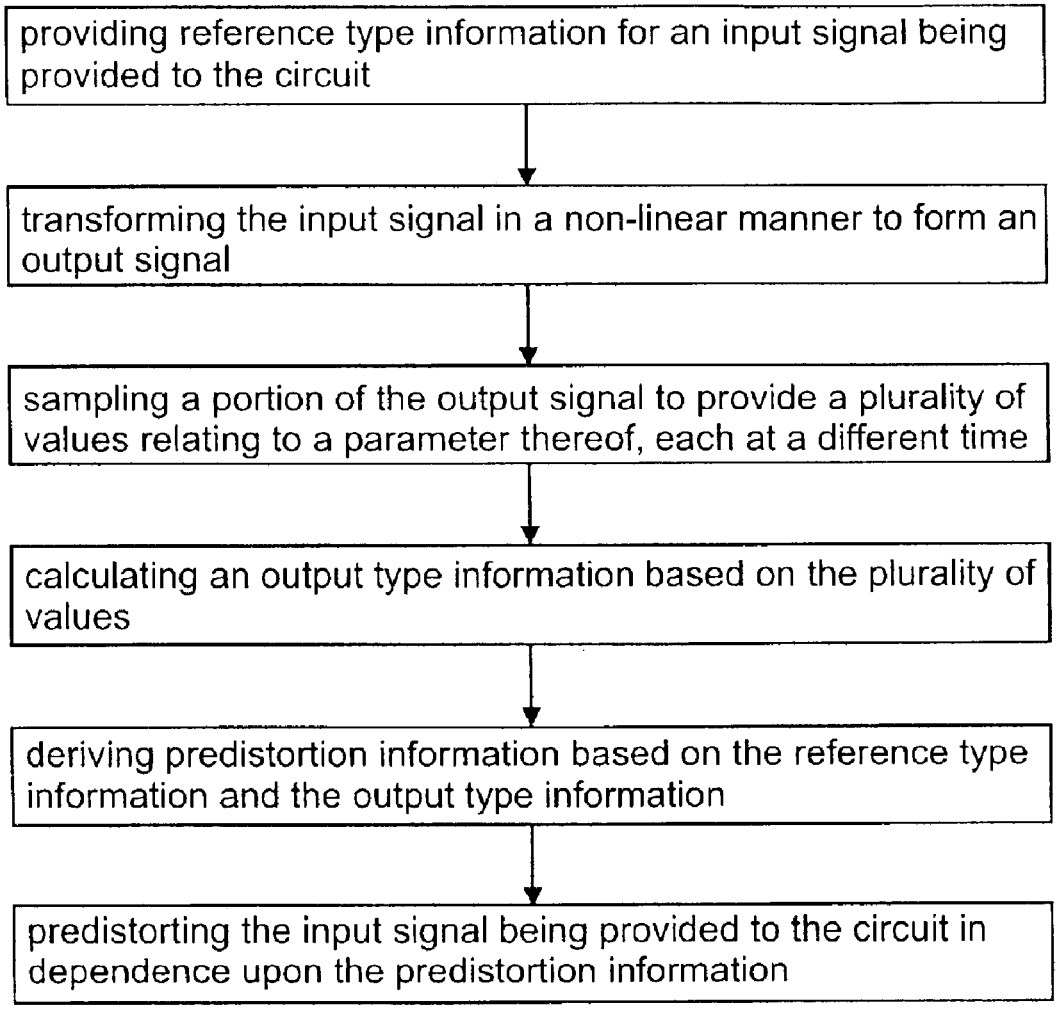
FIG. 14d illustrates operational steps used in the operating of transmitter circuits illustrated in FIGS. 14a, 14b and 14c.

The apparatus illustrated in FIGS. 14*a*, 14*b* and 14*c* operates in accordance with the method steps outlined in FIG. 14*d*. Reference type information is provided for the input signal that is provided to an input port of the predistorter circuit 1401. Circuit components 1401, 1405, 1406 and 1402, transform this input signal in a non-linear manner to form an output signal at the output port 1400*b*. This output signal is sampled to provide a plurality of values relating to a parameter thereof, where each value is sampled at a different time. Output type information is calculated based on the plurality of values. Predistortion information is derived based on the reference type information and the output type information. In dependence upon this predistortion information, the input signal being provided to the predistortion circuit is predistorted at an output port of the predistortion circuit in dependence upon the predistortion information. Preferably, the signal provided from the output port of the predistortion circuit is predistorted in such a manner that its predistortion substantially cancels the non-linear transformation of circuit components 1405, 1406, 1418 and 1402.

Preferably, to simplify the circuitry costs of the predistorter 1401 operation thereof is implemented at baseband frequency. In this case, there are at least three possible implementation schemes. In the first scheme, I and Q input signals to the predistorter are used to index entries within the LUT 1420, where the LUT has stored therein predistorted I and Q output data. This is a preferable implementation because it has the least latency and its accuracy is determined by the size of the LUT 1420. The more data that is stored in the LUT, the finer the resolution and thus the lower the predistorted I and Q output signal error. In a second implementation, an amplitude is computed from the pulse-shaped I and Q signals, where this amplitude is used to address entries within the LUT 1420. The LUT 1420 output data serve as a complex scaling factor that is used to multiply the I and Q components to yield the respective predistorted output signals. Advantageously, this implementation achieves a same accuracy as the first scheme, but utilizes a smaller LUT 1420; however with this second scheme, the predistorter circuit incurs an increase in complexity since six multiplier circuits and three adder circuits are additionally provided. In a third scheme, if the memory size of the LUT 1420 is further limited, an interpolator circuit is used to improve the accuracy of the predistorter output signals.

The modulation scheme of the input signal and the pulse-shaping filters determine the reference amplitude CDF and phase histogram. As soon as a modulation scheme is determined, such as M-PSK or M-QAM, and a pulse-shaping filter, such as a square-root raised-cosine filter or a Gaussian filter is selected, the reference amplitude CDF and phase histogram are fixed for the transmitter 1400, and they do not vary with the operating environment of the transmitter 1400. Therefore, these values are predetermined while operating the PA 1402 in its linear region and stored in the external memory 1413. In operation of the transmitter 1400, the actual amplitude CDF and phase histogram provided to the DSP 1411 are used to derive the amplitude and phase predistortion data points for the I and Q signals. Optionally, instead of deriving these data points during calibration of the transmitter 1400 during operation thereof, they are derived from computer simulation data.

Samples of output signal envelope amplitude and, optionally, of output signal envelope phase at the PA output port 1400*b* are accumulated in the DSP 1411 and used to compute the 1-D amplitude CDF and the 2-D phase histogram for the PA 1402 output signal. Advantageously, reconstructing the output signal envelope waveform in time is not performed. For determination of the 1-D amplitude CDF and the 2-D phase histogram, only statistical characteristics of the amplitude of the output signal envelope and phase of the output signal envelope are used. Thus, the sampling rate is not constrained by the Nyquist sampling criterion and is preferably less than the input signal symbol rate. Preferably, the sample-and-hold circuit of the ADC has a bandwidth wide enough to pass a significant portion of the envelope signal bandwidth. When the A/D converter operates at a low sampling rate, it takes more time to acquire enough samples to accurately compute the PA output signal amplitude CDF and phase histogram, but in nearly all practical cases this does not represent a limitation given that the PA transfer function does not change rapidly over time. The number of samples used in the calculation determines the accuracy of the linearization in accordance with an embodiment of the invention—the more samples that are used, the more accurate the system. Typically, acquisition of a few thousand samples is preferred in order to obtain an accurate amplitude CDF, while acquisition of a hundred thousand samples is preferred for an accurate 2-D phase histogram. Advantageously, with the use of a LUT, entries stored therein are updateable adaptively according to the PA output signal.

To those of skill in the art it is known that non-linearities in PAs are typically more significant as approaching the PA saturation point. Below this region where the non-linearities are significant, the phase shift and amplitude responses are very close to linear. Thus, with this a priori knowledge, ignoring of data below the region and forcing a linear response for responses below the region is preferred. The processes illustrated in FIGS. 7 and 13 thus utilize a linear extension to accommodate for limited dynamic range in the measurement circuit 1412.

Having limited bandwidth in the measurement circuit 1412 impacts on the accuracy of the measured envelope phase and the measured envelope amplitude of the PA output signal. A method to reduce performance loss associated to this limited bandwidth is to create a reference type information that also includes these bandwidth limitations. Computer simulations have shown that a bandwidth close to the channel bandwidth of interest aids in providing minimal performance losses. The aforementioned processes (FIGS. 7 and 13) are robust to these limitations since this limited bandwidth is taken into account when defining the reference type information.

DC offsets in the feedback circuit 1412 sometimes distort the measured type information and thus impact on the performance of the linearizer 1412. Advantageously, this is optionally reduced using a normalization of the measured type information about zero, where −0.5 to 0.5 is used for the normalized envelope amplitude and between −180 and 180 degrees are used for the phase.

In the case of only AM-AM compensation, a power detector 1416 (FIG. 14*b*) is preferably used in the measurement circuit 1412 to derive the envelope amplitude information from the PA output signal. In practice however, power detectors have a limited accuracy, where it is known to those of skill in the art that their square-law transfer function is not ideal. Computer simulations have shown that a small deviation of a few percent results in little degradation of performance when used with such limited accuracy power detectors. Such performance is easily achievable for power detectors, even at microwave frequencies.

When a quadrature demodulator 1419 is used to generate the I and Q baseband output signals, there is typically gain and phase imbalances present between the I and Q output signals. These imbalances are preferably estimated and compensated for within the DSP 1411 by first estimating a scaling factor to adjust the amplitude of one signal (I or Q) relative to the other, and then by estimating the amount of phase distortion between the I and Q samples. These imbalances are estimated and compensated for by using a technique such as the one outlined in U.S. Pat. No. 6,337,888, incorporated herein by reference.

Of course, the aforementioned assumes that a single frequency channel is provided to the transmitter for amplification. Advantageously, this concept is easily extended to multiple frequency channels (FIG. 15), where a set of frequency channels are treated as a single wideband frequency channel. Of course, when modulation schemes, transmission rates and pulse-shaping filters differ widely from frequency channel to frequency channel, and when a large number of frequency channels are provided, for example 100, then the establishment of a reference phase histogram that encompasses all of these frequency channels is non-trivial. Furthermore it is also non trivial when the large number of frequency channels are not symbol-synchronous. That said, it is predicted that these too are compensatable in accordance with embodiments of the invention.

Figure 15:
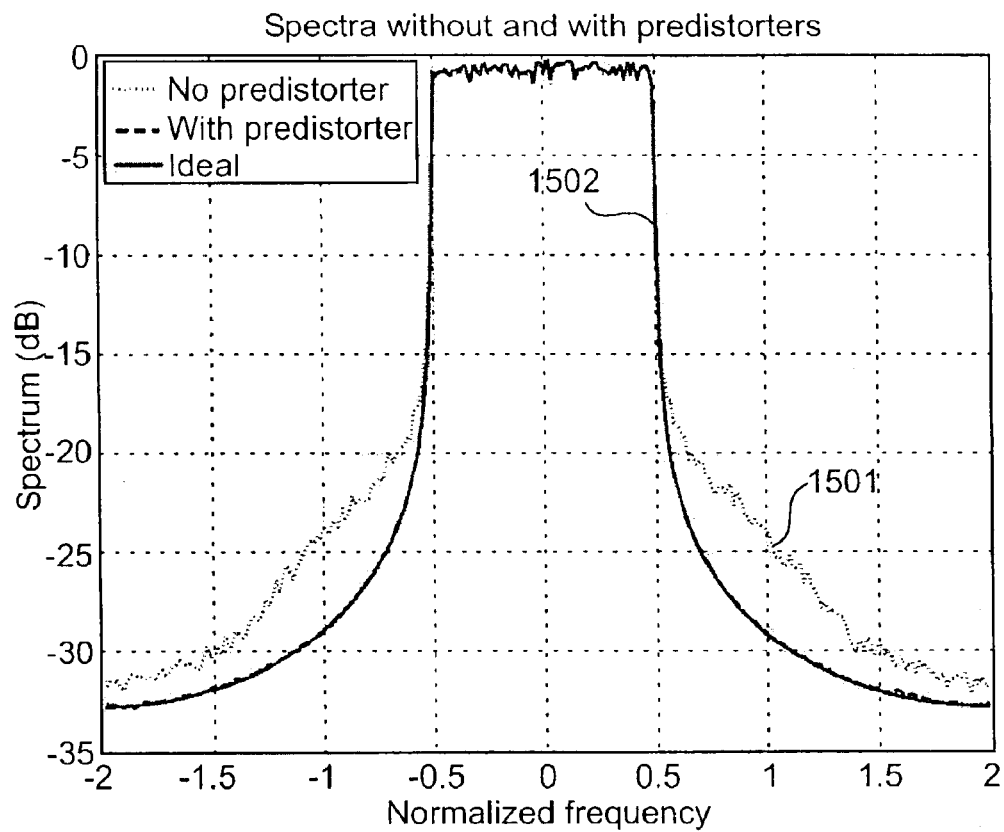
FIG. 15 illustrates an OFDM signal spectrum before and after predistortion compensation.
Figure 16A:
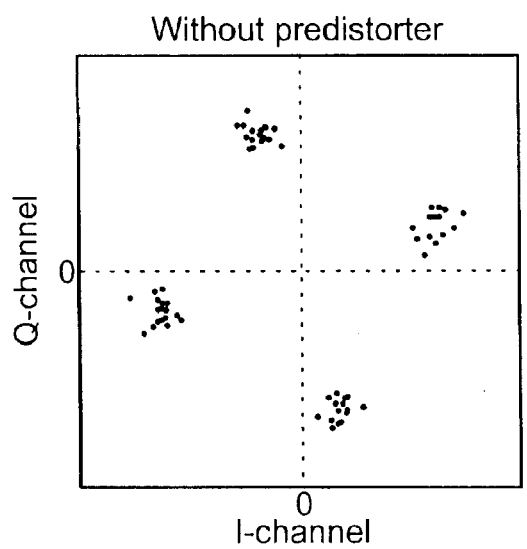
FIG. 16a illustrates received I-Q constellation for a single frequency channel before compensation for PA non-linearities.
Figure 16B:
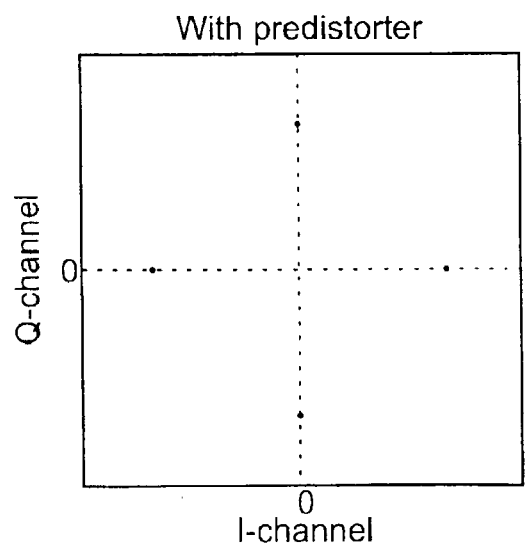
FIG. 16b illustrates received I-Q constellation for a single frequency channel after compensation for PA non-linearities.

FIG. 15 illustrates a frequency spectrum for an OFDM output signal without non-linearity compensation 1501 and with non-linearity compensation 1502 for a typical PA used in conjunction with the predistorter. Thus, the predistorter is used to compensate for several narrowband channels at different center frequencies arranged in an orthogonal frequency division multiplexing (OFDM) mode. FIG. 16*a* illustrates an I vs. Q constellation for a single frequency channel before compensation for PA non-linearities. FIG. 16*b* illustrates an I vs. Q constellation for a single frequency channel after compensation for PA non-linearities. In comparing the constellations, the benefits of the compensation for PA non-linearities are evident.

To evaluate the effectiveness of the proposed type-based predistorter 1401, a computer simulation of a 16-QAM communication system has been performed. Two SQRC filters with a roll-off factor of 0.35 are used in the transmitter as the pulse-shaping filters (1401*a* and 1404*b*), and two close to identical ones are used as the matched-filters in the receiver (not shown), where compensation for both AM-AM distortion and AM-PM distortion is performed. After obtaining the reference type information and actual type information for the phase and amplitude, data for the predistorter is derived and implemented using a look-up table with linear interpolation in this computer simulation.

Figure 17A:
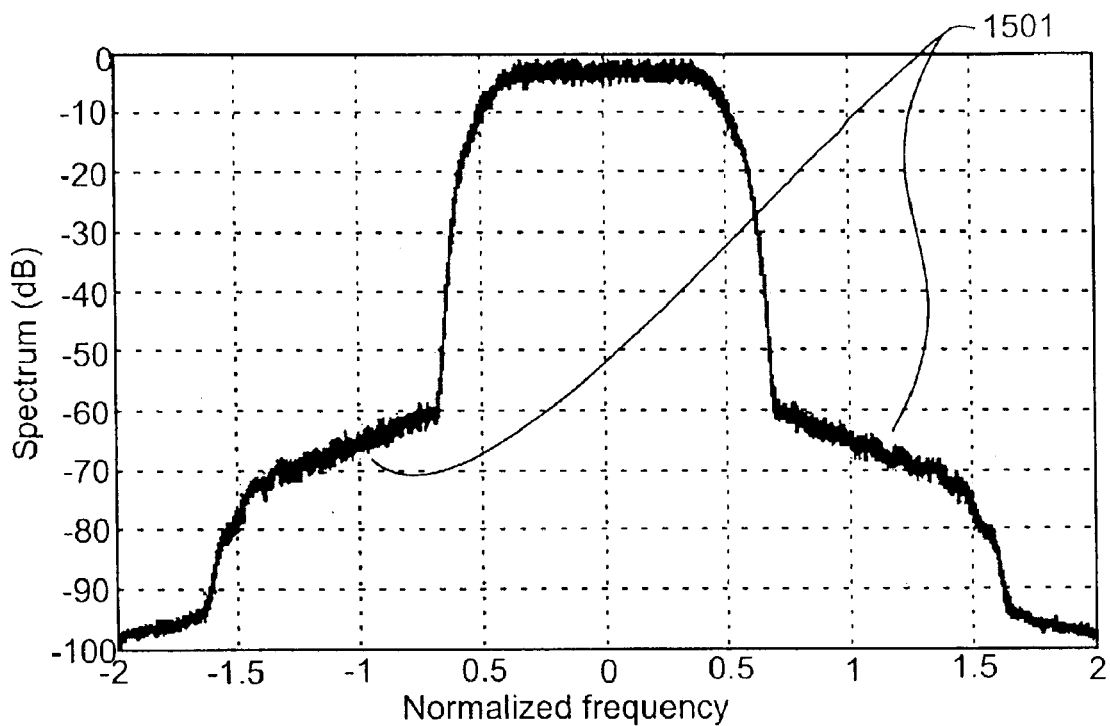
FIG. 17a illustrates a transmitted frequency spectrum for a 16-QAM channel without predistortion of the input signal to the PA.
Figure 17B:
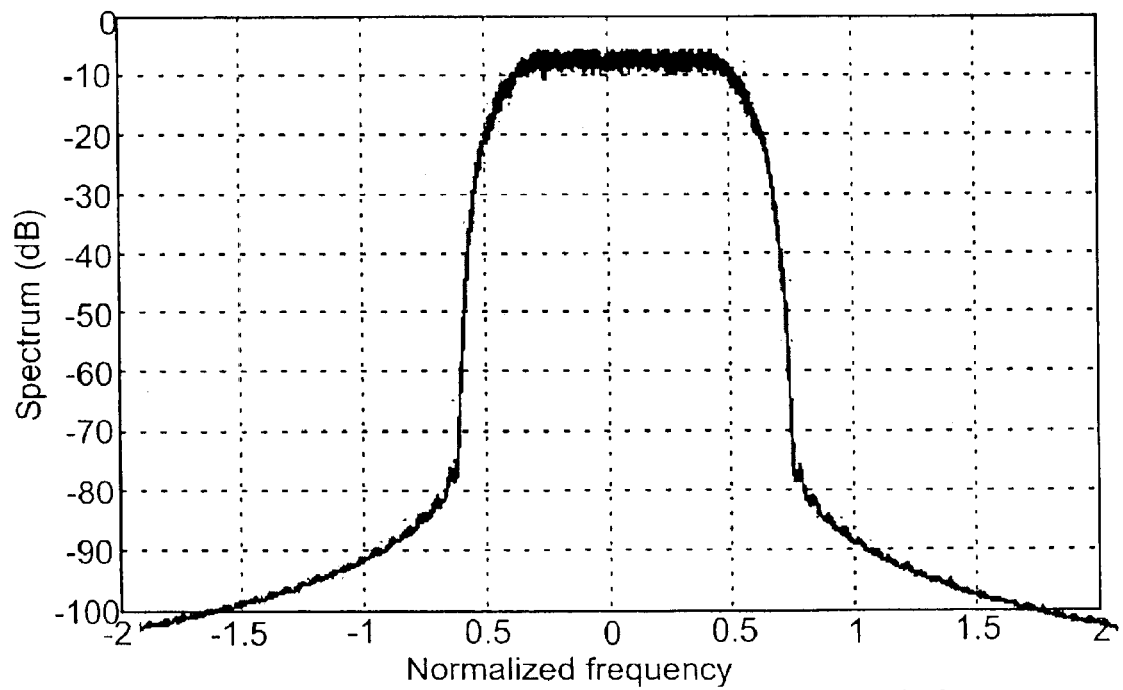
FIG. 17b illustrates a transmitted frequency spectrum for a 16-QAM channel where predistortion is provided to the input signal prior to being amplified by the PA.

FIG. 17*a* illustrates a transmitted spectrum for a frequency channel without predistortion of the input signal to the PA. Without the predistortion, a strong spectrum regrowth 1501 is observed at the side lobes of the frequency channel as a result of the PA non-linearity. Whereas, in that illustrated in FIG. 17*b*, predistortion is provided to the input signal prior to being amplified by the PA. From this figure it is evident that the side lobes of the frequency channel are significantly reduced due to the compensation of the PA non-linearity. Thus, the non-linear effect of the PA is advantageously eliminated and the spectrum is restored to its theoretical shape.

Figure 18A:
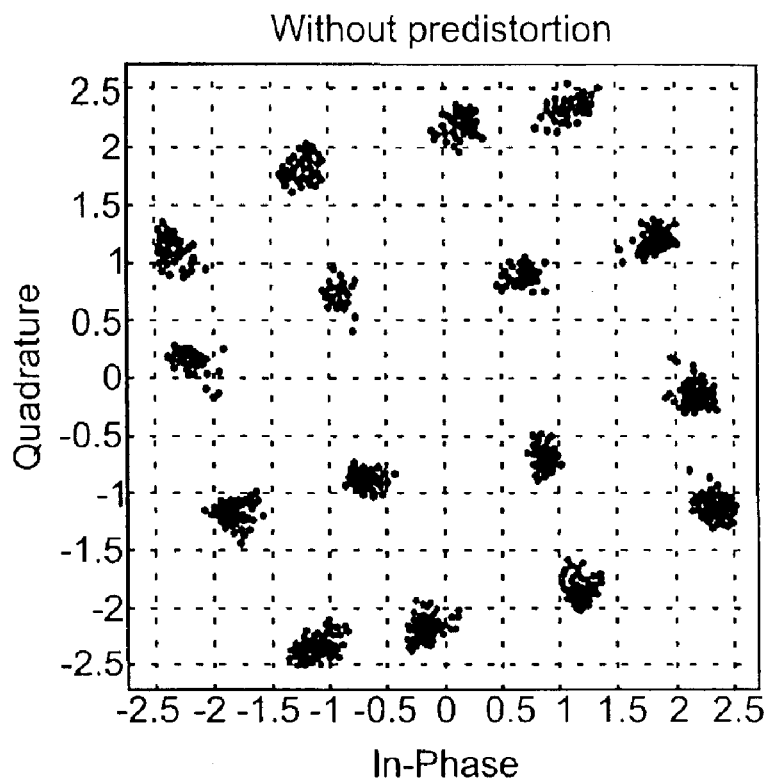
FIG. 18a illustrates received I-Q constellation without using the predistorter and FIG. 18b illustrates received I-Q constellation when used with the predistorter.
Figure 18B:
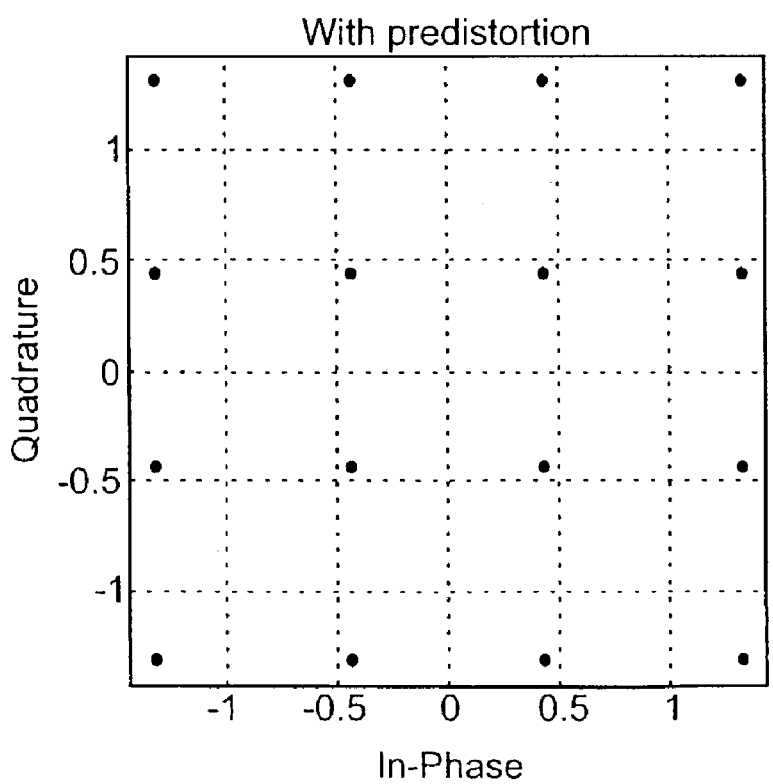

FIG. 18*a* illustrates received I-Q constellations without using the predistorter and FIG. 18*b* illustrates received I-Q constellations when used with the predistorter. For these graphs, an assumption is made that the carrier and symbol timing synchronization are close to ideal. The received constellation is distorted by the non-linearity of the PA in the transmitter if the predistorter is not used, but when predistorter is used within the transmitter the distortion introduced by the PA non-linearities are significantly reduced.

Advantageously, the predistorter technique is applicable to various digital communication systems that employ MPSK or MQAM input signal modulation. The technique is based on an output envelope of the non-linear circuit, and it advantageously does not use parametric modeling of the non-linear circuit, thus avoiding model mismatches or fitting errors. Furthermore, neither reconstructing of the modulated signal, nor comparing of the input signal and output signal of the power amplifier are performed in any forms, such as time and/or frequency, thus eliminating complex circuits and stringent timing/frequency requirement for signal synchronization.

Advantageously, the embodiments of the invention do not use any specific models and thus work over a wide range of non-linear characteristics of PAs, or other non-linear circuits. The embodiments of the invention do not reconstruct the modulating signal and furthermore are adaptive to cope with time-induced or temperature-induced variation in non-linear circuit response.

For AM-AM compensation an assumption is made in this specification that a square-law envelope detector is used. Optionally, linear or logarithmic detectors are useable. Similarly any complex envelope detectors or the like are optionally useable to recover the amplitude and phase information of the PA output envelope.

Advantageously, by employing the processes in accordance with embodiments of the invention, system adaptivity is realized and disruptions for the circuit being compensated are minimal. In addition, measurements of the output signal are made using a low sampling rate analog-to-digital converter with a sample-and-hold bandwidth sufficient to capture a portion of the output signal envelope bandwidth. Other components implemented are a complex envelope detector, an anti-aliasing filter, a DSP and a LUT. Furthermore, there is no need to synchronize the measurements performed on the PA output signal with any other signals.

In operation of the PA, the modulation scheme and pulse-shaping filter occasionally are changed as required. Thus, the external memory 1413 advantageously has stored therein reference type information for each of the modulation schemes that are used in conjunction with the pulse-shaping filters. This advantageously allows for the DSP to switch between the different reference type information stored within the external memory 1413 as the modulation scheme and/or the pulse-shaping filter are changed.

Additionally, the aforementioned apparatus in accordance with embodiment of the invention also operates when the input signal provided to the PA operates above at the saturation point of the PA. However, the provided compensation only compensates for a portion of the input signal that is below the saturation point and not above the saturation point.

Advantageously, the apparatus in conjunction with the aforementioned processes operates not only with monotonically increasing non-linear circuit response, but also with monotonically decreasing non-linear circuit response. Furthermore, if the non-linear circuit offers a discontinuity in its operation, then the aforementioned compensation technique is utilized within two adjacent regions to the discontinuity. Thus, a first reference type information is used within a first portion prior to the discontinuity. Upon encountering the discontinuity a second reference type information is utilized. Advantageously, since the embodiments of the invention offer a one to one mapping for an input signal to a non-linear circuit output signal, a requirement for having a monotonic relationship between the input port of the non-linear circuit and the output port is not necessary over the full range of operation.

The present invention thus provides a technique to determine data of operation for a signal predistorter to compensate for PA/circuit non-linear conversion distortions. In addition to leading to an increase in PA power efficiency, and enabling the use of more spectrum efficient modulation techniques, the predistortion function potentially eases the design and fabrication of power amplifiers by relaxing the linearity requirements. All of these benefits enable lower cost and more efficient communication systems.

Numerous other embodiments may be envisaged without departing from the spirit or scope of the invention.

What is claimed is:

1. A method of compensating for non-linear conversion distortions of a circuit comprising the steps of:

(a) providing a reference type information for an input signal being provided to the circuit;

(b1) mapping of the input signal to form a mapped signal; and, (b2) pulse shaping of the mapped signal, where the reference type information is based on a known pulse shaping function;

(c) sampling a portion of an output signal to provide a plurality of values relating to a parameter thereof, each at a different time;

(d) deriving predistortion information based on the reference type information and the plurality of values; and (e) predistorting one of the pulse shaped signal and the input signal being provided to the circuit in dependence upon the predistortion information.

2. A method according to claim 1, wherein the step (d) comprises a step of calculating an output type information based on the plurality of values and wherein the predistortion information is based at least in part on the output type information.

3. A method according to claim 1, wherein the step of (a) comprises the step of sampling to determine the reference type information.

4. A method according to claim 1, wherein the circuit comprises a power amplifier (PA).

5. A method according to claim 1, wherein the circuit consists of a power amplifier (PA).

6. A method according to claim 1, comprising the step of modulating the input signal, where the reference type information is based on a known modulating scheme.

7. A method according to claim 1,
    wherein mapping the input signal is performed using a known modulation scheme;
    wherein pulse shaping the input signal is performed using a known pulse shaping function; and
    providing a memory circuit, where a different reference type information is stored for each combination of a known modulation scheme and a known pulse shaping function.

8. A method according to claim 7, comprising the steps of:
    providing a lookup table (LUT); and,
    updating the LUT with predistortion data when at least one of the modulation scheme and the pulse shaping function is changed.

9. A method according to claim 1, wherein the reference type information and output type information are based on a same type.

10. A method according to claim 9, wherein a function based on the same type is a cumulative distribution function (CDF).

11. A method according to claim 9, wherein a function based on the same type is a probability density function (PDF).

12. A method according to claim 1, wherein the non-linear conversion distortion are a result of AM-AM conversion by a non-linear circuit.

13. A method according to claim 1, wherein the non-linear conversion distortions are a result of AM-PM conversion by a non-linear circuit.

14. A method according to claim 1, wherein an output type information comprises at least one of amplitude information and phase information about an output signal envelope.

15. A method according to claim 14, wherein the derived predistortion information from the reference type information comprises at least one of amplitude information and phase information about the input signal.

16. A method according to claim 1, wherein the input signal is mapped to symbols at a predetermined symbol rate and where the step of sampling is performed at a rate that is lower than a predetermined symbol rate.

17. A method according to claim 1, wherein the steps of (a) through (e) are performed in a transmitter system without disrupting the operation of the transmitter system.

18. A method according to claim 1, wherein pulse shaping is performed after modulation of the input signal.

19. A method according to claim 14, comprising the step of:
    providing a power detector, the power detector for detecting the power of an output signal in the step of sampling and where the output type information comprises amplitude information about the output signal envelope.

20. A method according to claim 19, comprising the step of:
    providing a complex envelope detector for detecting at least one of the amplitude and phase information in the step of sampling the output signal envelope and where the output type information comprises at least one of amplitude and phase information.

21. A method according to claim 4, wherein the PA has a monotonically increasing and continuous relationship between a signal provided on an input port and a signal provided on an output port up to an output saturation point of the PA.

22. A method according to claim 2, wherein the step of deriving comprises the steps of:
- determining a plurality of data values, each data value for mapping a data point along the output type information to a data point along the reference type information; and,
- storing the data values.

23. A method according to claim 22, wherein the step of storing comprises the step of providing a lookup table (LUT) for storing of predistortion data derived from the data values, wherein the data values are stored in a memory circuit.

24. A method according to claim 22, wherein the mapping is non-linear.

25. A method according to claim 1, wherein steps (a) though (e) are performed absent reconstructing of the input signal.

26. A method according to claim 1, wherein steps (a) through (e) are performed absent comparing the input signal to an output signal of the circuit.

27. A method according to claim 1, wherein steps (a) through (e) are performed absent reconstructing an output signal envelope waveform in time.

28. A method according to claim 1, wherein the input signal comprises data within each of a plurality of modulated frequency channels, each channel from the plurality having a different central frequency.

29. A method according to claim 1, wherein the step of deriving comprises the steps of:
- determining a conditional histogram of a linear circuit output phase for a predetermined input signal amplitude;
- determining a conditional histogram of a non-linear circuit output phase for a predetermined input signal amplitude; and
- cross correlating the two determined conditional histograms to derive phase shift information for AM-PM conversion for forming a portion of the predistortion information.

30. A method according to claim 1, comprising the step of processing the input signal with the predistortion information so that an output type information is more representative of the reference type information post processing than before processing.

31. A method according to claim 1, wherein the circuit is a transmitter system.

32. A method according to claim 1, wherein a transform of the circuit provides a unique mapping of an input signal parameter to an output signal parameter, the unique mapping being unique up to a saturation point of the circuit.

33. A method according to claim 32, wherein the transform is a piecewise continuous function.

34. A method according to claim 32, wherein the transform is a continuous function.

35. A method according to claim 32, wherein the transform is monotonic.

36. A method according to claim 6, wherein pulse shaping is performed before modulation of the input signal.

37. A circuit comprising:
- a memory circuit for storing a reference type information for an input signal being provided to the circuit;
- a transforming circuit for transforming the input signal in a non-linear manner to form an output signal comprising:
  - a mapping circuit for mapping of the input signal to form a mapped signal, and
  - a pulse shaping circuit for pulse shaping of the mapped signal, where the reference type information is based on a known pulse shaping function;
- a sampling circuit for sampling a portion of the output signal to provide a plurality of values relating to a parameter thereof, each at a different time;
- a processor for deriving predistortion information based on the reference type information and the plurality of values; and
- a predistortion circuit for predistorting the input signal being provided to the circuit in dependence upon the predistortion information.

38. A circuit according to claim 37, wherein the processor comprises circuitry for calculating an output type information based on the plurality of values and wherein the predistortion information is based at least in part on the output type information.

* * * * *